(12) United States Patent
Shimamoto

(10) Patent No.: US 11,289,429 B2
(45) Date of Patent: Mar. 29, 2022

(54) THREE-DIMENSIONAL MEMORY DIE CONTAINING STRESS-COMPENSATING SLIT TRENCH STRUCTURES AND METHODS FOR MAKING THE SAME

(71) Applicant: SANDISK TECHNOLOGIES LLC, Addison, TX (US)

(72) Inventor: Kazuma Shimamoto, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 92 days.

(21) Appl. No.: 16/594,892

(22) Filed: Oct. 7, 2019

(65) Prior Publication Data

US 2021/0104472 A1    Apr. 8, 2021

(51) Int. Cl.
| | |
|---|---|
| *H01L 27/11573* | (2017.01) |
| *H01L 23/00* | (2006.01) |
| *H01L 27/11519* | (2017.01) |
| *H01L 27/11524* | (2017.01) |
| *H01L 27/11529* | (2017.01) |
| *H01L 27/11582* | (2017.01) |

(Continued)

(52) U.S. Cl.
CPC ........ *H01L 23/562* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 5,915,167 | A | 6/1999 | Leedy |
| 9,343,358 | B1 | 5/2016 | Xu |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Benjamin P Sandvik
(74) *Attorney, Agent, or Firm* — The Marbury Law Group PLLC

(57) ABSTRACT

A vertically alternating sequence of continuous insulating layers and continuous sacrificial material layers is formed over a substrate. Memory stack structures are formed through the vertically alternating sequence. Divider trenches and slit trenches are formed such that the divider trenches laterally extend along a first horizontal direction and divide the vertically alternating sequence into a plurality of alternating stacks of insulating layers and sacrificial material layers, and the slit trenches laterally extend along a second horizontal direction that is perpendicular to the first horizontal direction. The sacrificial material layers are replaced with electrically conductive layers employing the divider trenches as a conduit for an etchant and for a reactant. Each of the divider trenches and the slit trenches are filled with material portions to provide a plurality of divider trench fill structures in the divider trenches and to provide a plurality of slit trench fill structures in the slit trenches.

16 Claims, 36 Drawing Sheets

(51) Int. Cl.
    *H01L 27/11565* (2017.01)
    *H01L 27/1157* (2017.01)
    *H01L 27/11556* (2017.01)

(56) References Cited

U.S. PATENT DOCUMENTS

| | | |
|---|---|---|
| 9,419,135 B2 | 8/2016 | Baenninger et al. |
| 9,455,267 B2 | 9/2016 | Zhang et al. |
| 9,589,981 B2 | 3/2017 | Nishikawa et al. |
| 9,646,981 B2 | 5/2017 | Nishikawa et al. |
| 9,698,223 B2 | 7/2017 | Sharangpani et al. |
| 9,799,671 B2 | 10/2017 | Pachamuthu et al. |
| 9,887,207 B2 | 2/2018 | Zhang et al. |
| 9,917,093 B2 | 3/2018 | Chu et al. |
| 10,103,161 B2 | 10/2018 | Ito et al. |
| 10,242,994 B2 | 3/2019 | Inomata et al. |
| 2011/0057250 A1 | 3/2011 | Higashi |
| 2015/0303214 A1* | 10/2015 | Kim .................. H01L 27/11575 257/329 |
| 2016/0049421 A1 | 2/2016 | Zhang et al. |
| 2016/0071872 A1 | 3/2016 | Saito et al. |
| 2016/0079255 A1* | 3/2016 | Sonehara .......... H01L 27/11582 257/324 |
| 2016/0086969 A1 | 3/2016 | Zhang et al. |
| 2016/0141419 A1 | 5/2016 | Baenninger et al. |
| 2016/0149002 A1 | 5/2016 | Sharangpani et al. |
| 2016/0268294 A1 | 9/2016 | Hashimoto et al. |
| 2016/0300848 A1 | 10/2016 | Pachamuthu et al. |
| 2016/0365351 A1 | 12/2016 | Nishikawa et al. |
| 2016/0365352 A1 | 12/2016 | Nishikawa et al. |
| 2017/0103995 A1 | 4/2017 | Hatano et al. |
| 2017/0373078 A1 | 12/2017 | Chu et al. |
| 2017/0373087 A1 | 12/2017 | Ito et al. |
| 2018/0003049 A1 | 1/2018 | Inomata et al. |
| 2018/0047739 A1 | 2/2018 | Dorhout et al. |
| 2019/0006384 A1* | 1/2019 | Iwasaki ............. H01L 27/11521 |
| 2019/0067310 A1 | 2/2019 | Matsuda |
| 2019/0363079 A1 | 11/2019 | Thei et al. |
| 2019/0371813 A1* | 12/2019 | Oike .................. H01L 23/5226 |
| 2021/0036010 A1* | 2/2021 | Sim .................. H01L 27/11582 |

OTHER PUBLICATIONS

U.S. Appl. No. 16/249,352, filed Jan. 16, 2019, SanDisk Technologies LLC.
U.S. Appl. No. 16/251,782, filed Jan. 18, 2019, SanDisk Technologies LLC.
U.S. Appl. No. 16/367,455, filed Mar. 28, 2019, SanDisk Technologies LLC.
U.S. Appl. No. 16/516,726, filed Jul. 19, 2019, SanDisk Technologies LLC.
U.S. Appl. No. 16/552,089, filed Aug. 27, 2019, SanDisk Technologies LLC.
USPTO Communication, Notice of Allowance and Fee(s) Due for U.S. Appl. No. 16/594,959, dated Jan. 19, 2021, 10 pages.
Notification of Transmittal of the International Search Report and Written Opinion of the International Search Authority for International Patent Application No. PCT/US2020/025606, dated Jul. 30, 2020, 12 pages.
Onuma, T., "Three-Dimensional Memory Die Containing Stress-Compensating Slit Trench Structures and Methods For Making The Same," U.S. Appl. No. 16/594,959, filed Oct. 7, 2019.
Non-Final Office Action for U.S. Appl. No. 16/594,959, dated Oct. 23, 2020, 18 pages.

* cited by examiner

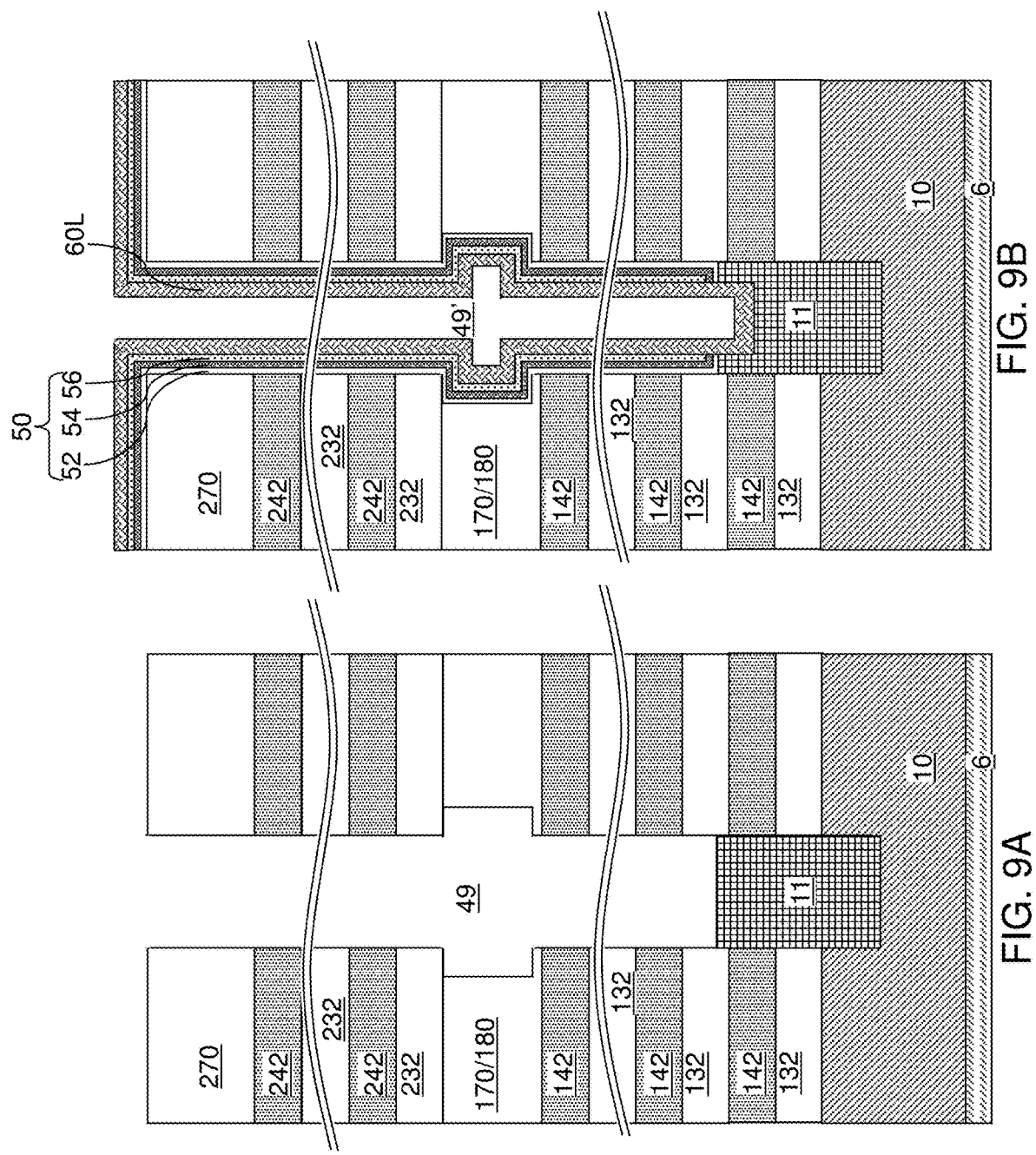

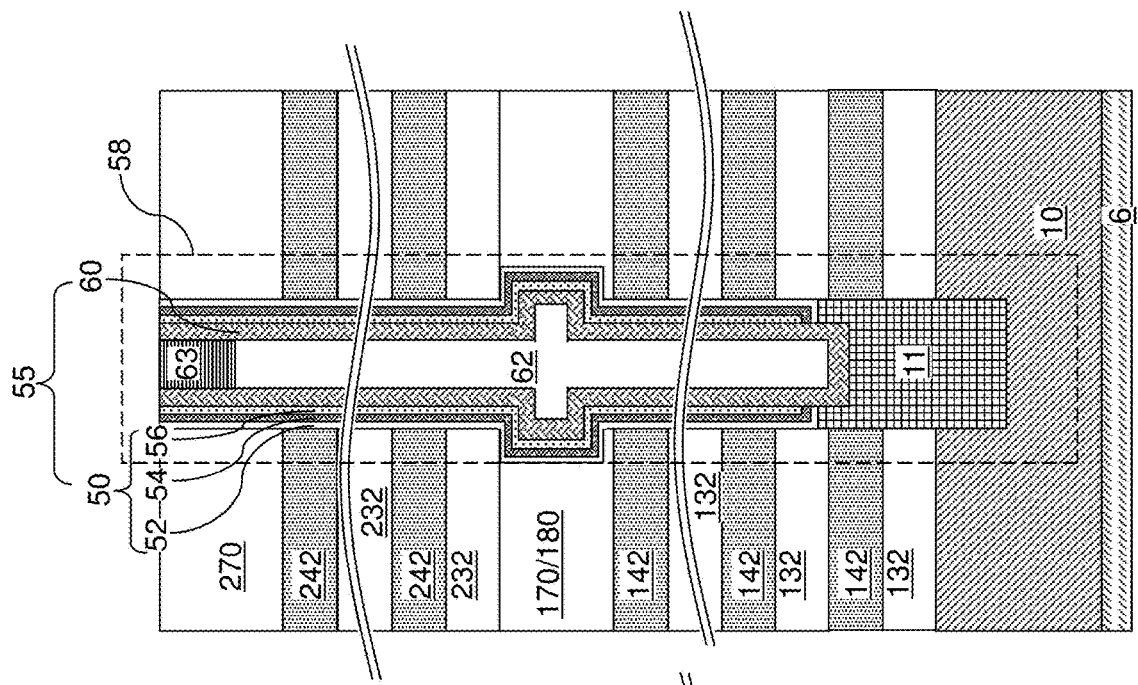
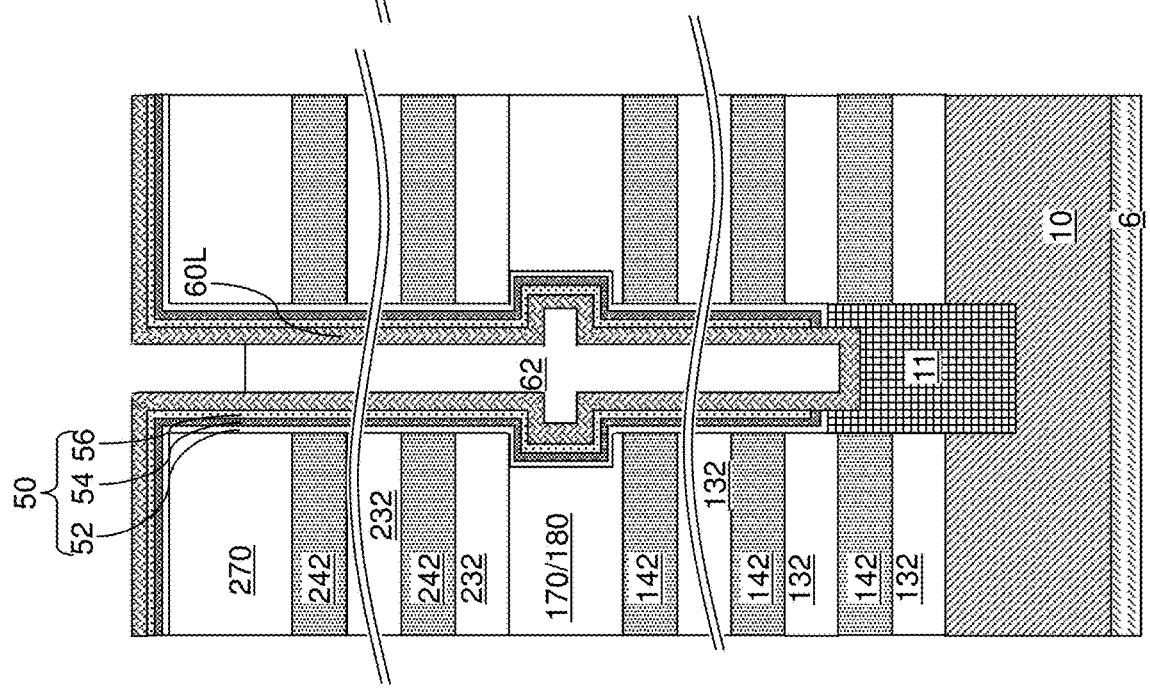
FIG. 9C
FIG. 9D

THREE-DIMENSIONAL MEMORY DIE CONTAINING STRESS-COMPENSATING SLIT TRENCH STRUCTURES AND METHODS FOR MAKING THE SAME

FIELD

The present disclosure relates generally to the field of semiconductor devices, and particularly to three-dimensional memory dies including stress-compensating slit trench structures for reducing wafer warpage and methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor die is provided, which comprises: a plurality of alternating stacks of insulating layers and electrically conductive layers that are located over a substrate and laterally spaced apart by a plurality of divider trench fill structures that laterally extend along a first horizontal direction, wherein the plurality of alternating stacks and the plurality of divider trench fill structures are alternately interlaced along a second horizontal direction that is perpendicular to the first horizontal direction; a plurality of sets of memory stack structures, wherein each set of memory stack structures vertically extends through a respective alternating stack of the plurality of alternating stacks, and wherein each of the memory stack structures comprises a respective vertical semiconductor channel and a respective memory film; and a plurality of slit trench fill structures that laterally extend along the second horizontal direction by a lateral distance that is greater than a lateral extent along the second horizontal direction of a set of at least two neighboring alternating stacks of the plurality of alternating stacks, wherein each of the plurality of divider trench fill structures and each of the plurality of slit trench fill structures comprise a respective set of at least one material portion having a same material composition.

According to another embodiment of the present disclosure, a method of forming a semiconductor structure is provided, which comprises the steps of: forming a vertically alternating sequence of continuous insulating layers and continuous sacrificial material layers over a substrate; forming a plurality of sets of memory stack structures, wherein each set of memory stack structures vertically extends through a respective region of the vertically alternating sequence, and wherein each of the memory stack structures comprises a respective vertical semiconductor channel and a respective memory film; forming divider trenches and slit trenches, wherein the divider trenches laterally extend along a first horizontal direction and divide the vertically alternating sequence into a plurality of alternating stacks of insulating layers and sacrificial material layers, and the slit trenches laterally extend along a second horizontal direction that is perpendicular to the first horizontal direction; replacing the sacrificial material layers in the plurality of alternating stacks with electrically conductive layers employing the divider trenches as a conduit for an etchant that etches the sacrificial material layers and for a reactant that deposits a conductive material of the electrically conductive layers; and depositing a set of at least one material in each of the divider trenches and the slit trenches, wherein a plurality of divider trench fill structures is formed in the divider trenches and a plurality of slit trench fill structures is formed in the slit trenches.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

DETAILED DESCRIPTION

Figure 1A:
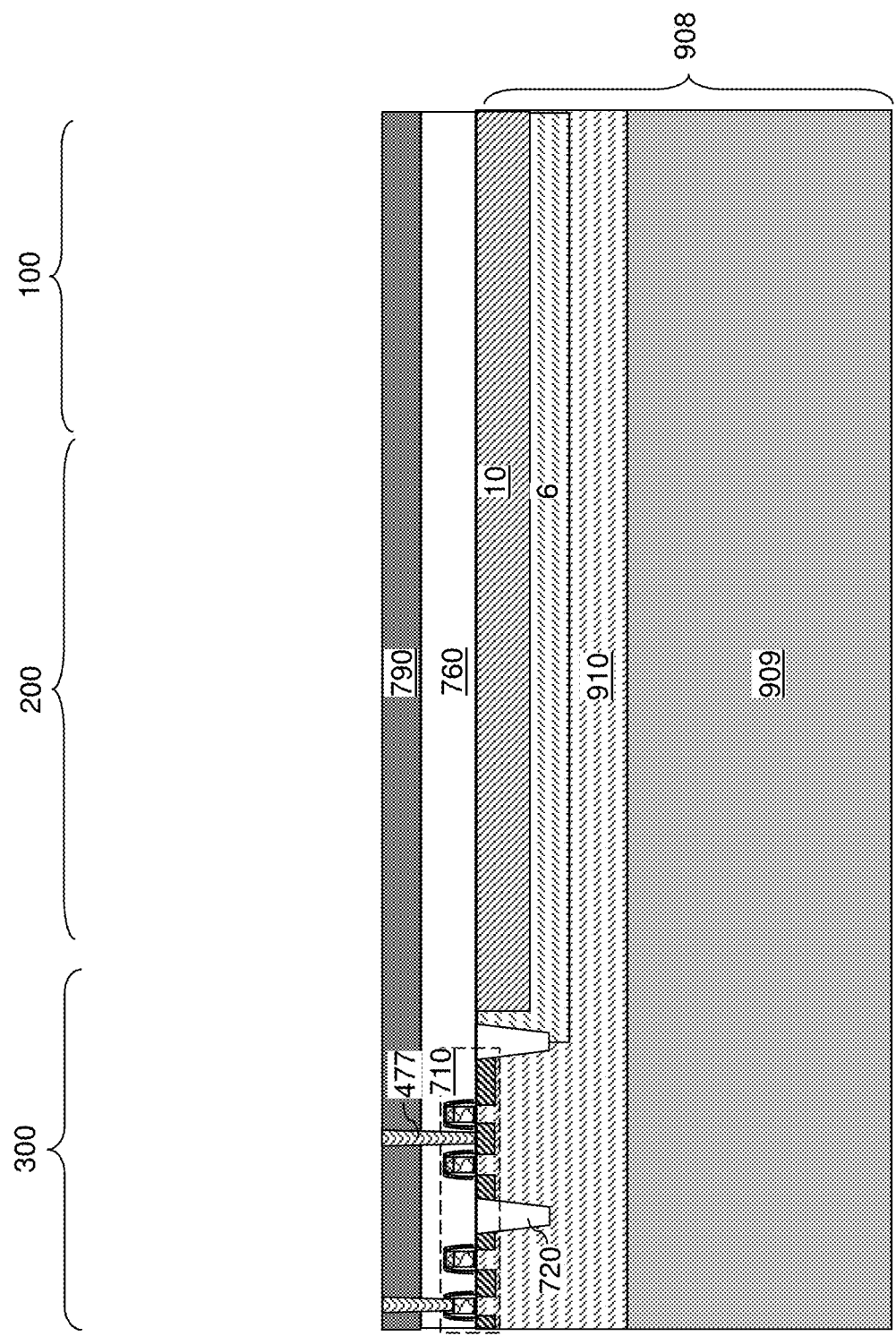
FIG. 1A is a vertical cross-sectional view of a region of an exemplary structure for forming a semiconductor die after formation of various doped semiconductor regions, field effect transistors, a planarization dielectric layer, an etch stop dielectric layer, and sacrificial via structures according to an embodiment of the present disclosure.

In three-dimensional memory devices, slit trenches laterally extending along a horizontal direction that is perpendicular to vertical steps of an alternating sack of insulating layers and sacrificial material layers may be used to provide conduits through which a liquid etchant is provided for removing the sacrificial material layers to form recesses and through which a reactant is provided for forming electrically conductive layers (e.g., word lines) in the recesses. Because the slit trenches laterally extend along a same horizontal direction (e.g., word line direction), mechanical stress in the three-dimensional memory devices induces deformation of a wafer into a saddleback shape upon replacement of the sacrificial material layers with the electrically conductive layers. A saddleback-shaped deformation of the wafer induces various difficulties during subsequent formation of metal interconnect structures. The embodiments of the present disclosure are directed to three-dimensional memory dies including stress-compensating slit trench structures for reducing wafer warpage and methods for forming the same, the various aspects of which are described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
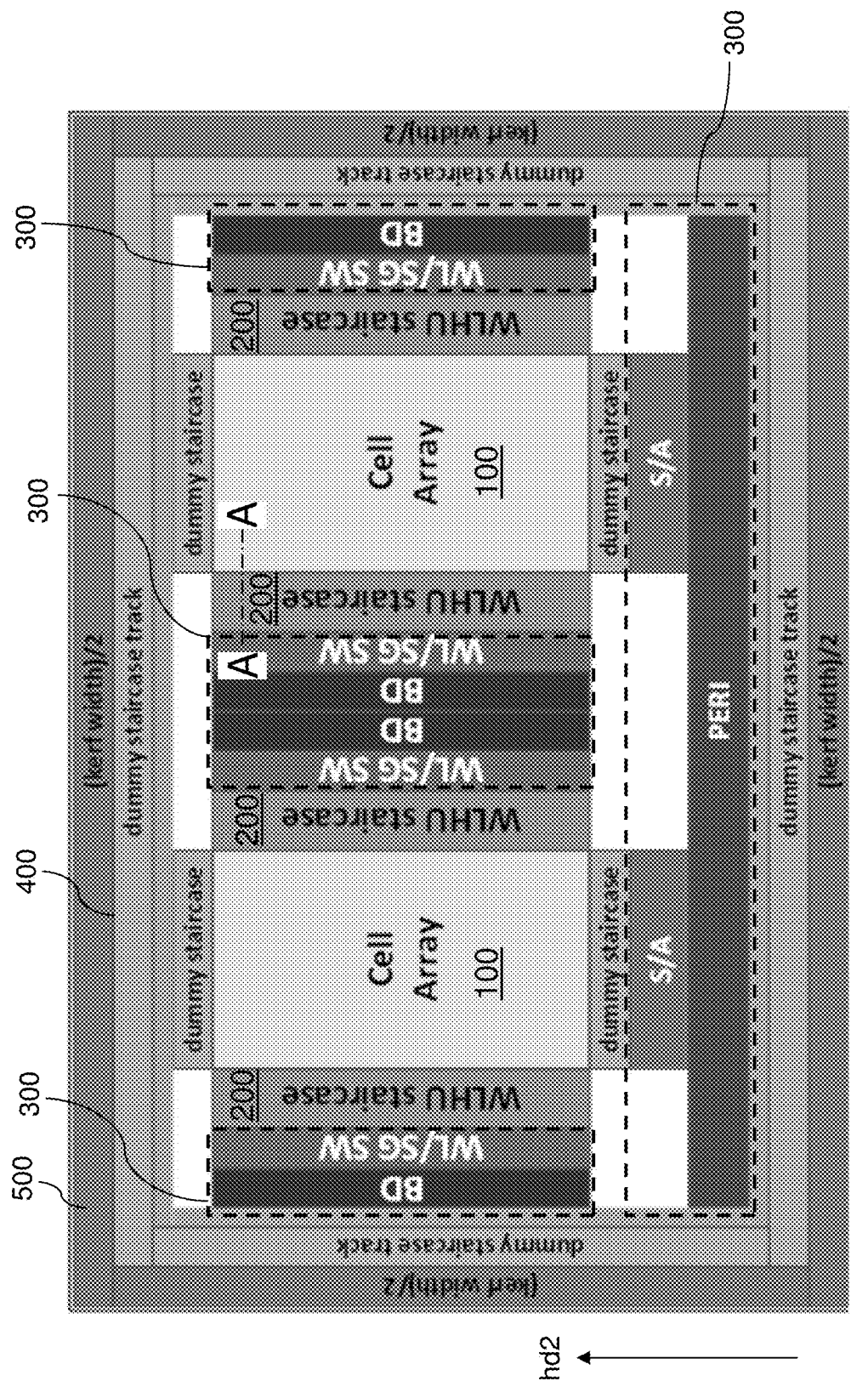
FIG. 1B is a top-down view of a unit die area of the exemplary structure of FIG. 1A.

Referring to FIGS. 1A and 1B, an exemplary structure for forming a semiconductor die is illustrated. FIG. 1B illustrates the layout of various regions within a unit die area of the exemplary structure, and FIG. 1A is a vertical cross-sectional view of the exemplary structure. In one embodiment, the exemplary structure can include a substrate 908, which may be provided by forming various doped semiconductor regions (such as doped wells) in an upper portion of a semiconductor wafer (which may be, for example, a single crystal silicon wafer, such as a 300 mm silicon wafer or a 200 mm silicon wafer). For example, the substrate 908 can include a substrate layer 909, a semiconductor material layer 910, a first doped well 6 that is embedded in the semiconductor material layer 910, and a second doped well 10 that is embedded in the second doped well 6. In an illustrative example, the semiconductor material layer 910 and the second doped well 10 can have p-type doping, and the first doped well 6 can have n-type doping. The substrate layer 909 may be a semiconductor substrate (e.g., silicon wafer), a semiconductor material layer (e.g., an epitaxial silicon layer on silicon wafer), or an insulating layer (as in the case of a semiconductor-on-insulator substrate). Additional doped wells may be formed as needed to provide various semiconductor devices thereupon. Each of the doped wells can be p-doped or n-doped, and can have an atomic concentration of electrical dopants in a range from $1.0 \times 10^{14}/cm^3$ to $1.0 \times 10^{18}/cm^3$, although lesser and greater atomic concentrations may also be used.

Various semiconductor devices 710 can be formed on the substrate. The various semiconductor devices 710 can include complementary metal-oxide-semiconductor (CMOS) devices, and can include various peripheral circuits (i.e., driver circuits) that can be used to operate a three-dimensional array of memory elements to be subsequently formed on the substrate 908 within the cell array regions. As used herein, a "cell array region" refers to a region in which a three-dimensional array of memory elements is formed, such as a memory plane. A cell array region (e.g., a memory plane) is also referred to as a memory array region 100. The semiconductor devices 710 can include field effect transistors that are formed on the top surface of the substrate 908.

Generally, the semiconductor devices 710 can include any circuit that can be used to control operation of at least one three-dimensional array of memory elements to be subsequently formed. For example, the semiconductor devices 710 can include peripheral devices that are used to control operation of a three-dimensional array of memory elements to be subsequently formed. The regions in which the peripheral devices are formed are collectively referred to as a peripheral device region 300. The peripheral device region 300 can include various regions configured to provide specific types of peripheral devices. In an illustrative example, sense amplifier circuits can be formed within sense amplifier regions, which are marked as "S/A" in FIG. 1B. Bit line driver circuits can be formed within bit line driver regions, which are marked as "BD" in FIG. 1B. Word line switches and select gate electrode switch can be formed in word line and select gate electrode switch regions, which are marked as "WL/SG SW" in FIG. 1B. Additional miscellaneous peripheral devices can be formed in a miscellaneous peripheral device region, which is marked as "PERI" in FIG. 1B. Each three-dimensional array of memory elements can be subsequently formed employing alternating stacks of insulating layers and electrically conductive layers (e.g., word lines). In this case, the layers within the alternating stacks can be patterned to provide stepped surfaces, and contact via structures contacting a respective one of the electrically conductive layers can be formed in such stepped surfaces. Such regions are referred to as word line hookup staircase regions, and are marked as "WLHU staircase" in FIG. 1B. The word line hookup staircase regions are also referred to as staircase regions 200. Dummy stepped surfaces that are not used to provide electrical contacts to the electrically conductive layers can be formed around each cell array region (i.e., memory array region 100). Regions including such dummy stepped surfaces are herein referred to as dummy staircase regions, and are marked as "dummy staircase" in FIG. 1B. Additional dummy staircase regions can be formed inside a periphery of a die area. The additional dummy staircase regions are herein referred to as "dummy staircase tracks". Seal ring structures and a guard ring structure are subsequently formed at the outer edge of the dummy staircase tracks, which define the outer boundary of a semiconductor chip.

The region in which the seal ring structures and the guard ring structure are subsequently formed is herein referred to as a seal ring and guard ring region 400. Kerf areas 500 are provided outside the areas of the seal ring structures. The area within an outer periphery of the seal ring and guard ring region defines the area of a semiconductor die to be subsequently formed. The area of the semiconductor die can have a generally rectangular shape. The horizontal direction of a first pair of sidewalls of the semiconductor die is herein referred to as a first horizontal direction hd1 (e.g., word line direction), and the horizontal direction of a second pair of sidewalls of the semiconductor die is herein referred to as a second horizontal direction hd2 (e.g., bit line direction), which is perpendicular to the first horizontal direction hd1. The kerf areas can include various test structures and alignment structures that may, or may not, be destroyed during singulation of the substrate 908 and semiconductor devices thereupon into a plurality of semiconductor dies. The unit die area includes half of the width of each kerf area.

A planarization dielectric layer 760 can be formed over the semiconductor devices 710. For example, the planarization dielectric layer 760 can be formed over gate structures and active regions (such as source regions and drain regions) of the field effect transistors. The planarization dielectric layer 760 can include a planarizable dielectric material such as a silicate glass. The top surface of the planarization dielectric layer 760 can be planarized, for example, by chemical mechanical planarization.

An etch stop dielectric layer 790 can be formed over the planarization dielectric layer 760. The etch stop dielectric layer 790 can include a dielectric material that can be employed as an etch stop material during etching of an overlying dielectric material portion to be subsequently formed. In one embodiment, the etch stop dielectric layer 70 can include at least one dielectric material sublayer including a material that is different from the material of sacrificial material layers of a vertically alternating sequence of insulating layers and sacrificial material layers. For example, if the overlying dielectric material portion includes silicon oxide, the etch stop dielectric layer 790 can include a layer stack of a dielectric metal oxide layer and a silicon nitride layer. In one embodiment, the etch stop dielectric layer 790 can include a layer stack of a silicon nitride layer and an aluminum oxide layer.

Sacrificial via structures 477 can be formed through the etch stop dielectric layer 790 and the planarization dielectric layer 760 onto a top surface of a respective element of the semiconductor devices 710. For example, a photoresist layer (not shown) can be applied over the etch stop dielectric layer 790, and can be lithographically patterned to form openings over components of the semiconductor devices 710. An anisotropic etch process can be performed to form via cavities through the etch stop dielectric layer 790 and the planarization dielectric layer 760 underneath the openings in the photoresist layer. The via cavities can extend to a top surface of a respective underlying component of the semiconductor devices 710. The photoresist layer may be removed, for example, by ashing, and a sacrificial fill material (such as amorphous silicon, a silicon-germanium alloy, a polymer material, borosilicate glass, or organosilicate glass) can be deposited in the via cavities to form the sacrificial via structures 477. Excess portions of the sacrificial fill material can be removed from above the horizontal plane including the top surface of the etch stop dielectric layer 790. Each of the sacrificial via structures 477 can contact a component of a respective one of the semiconductor devices 710. For example, a subset of the sacrificial via structures 477 can contact a respective gate electrode, and another subset of the sacrificial via structures can contact a respective active region (such as a source region or a drain region). Generally, electrically active nodes of the semiconductor devices 710 can be contacted by a respective sacrificial via structure 477. Top surfaces of the sacrificial via structures 477 can be coplanar with the top surface of the etch stop dielectric layer 790.

Figure 2:
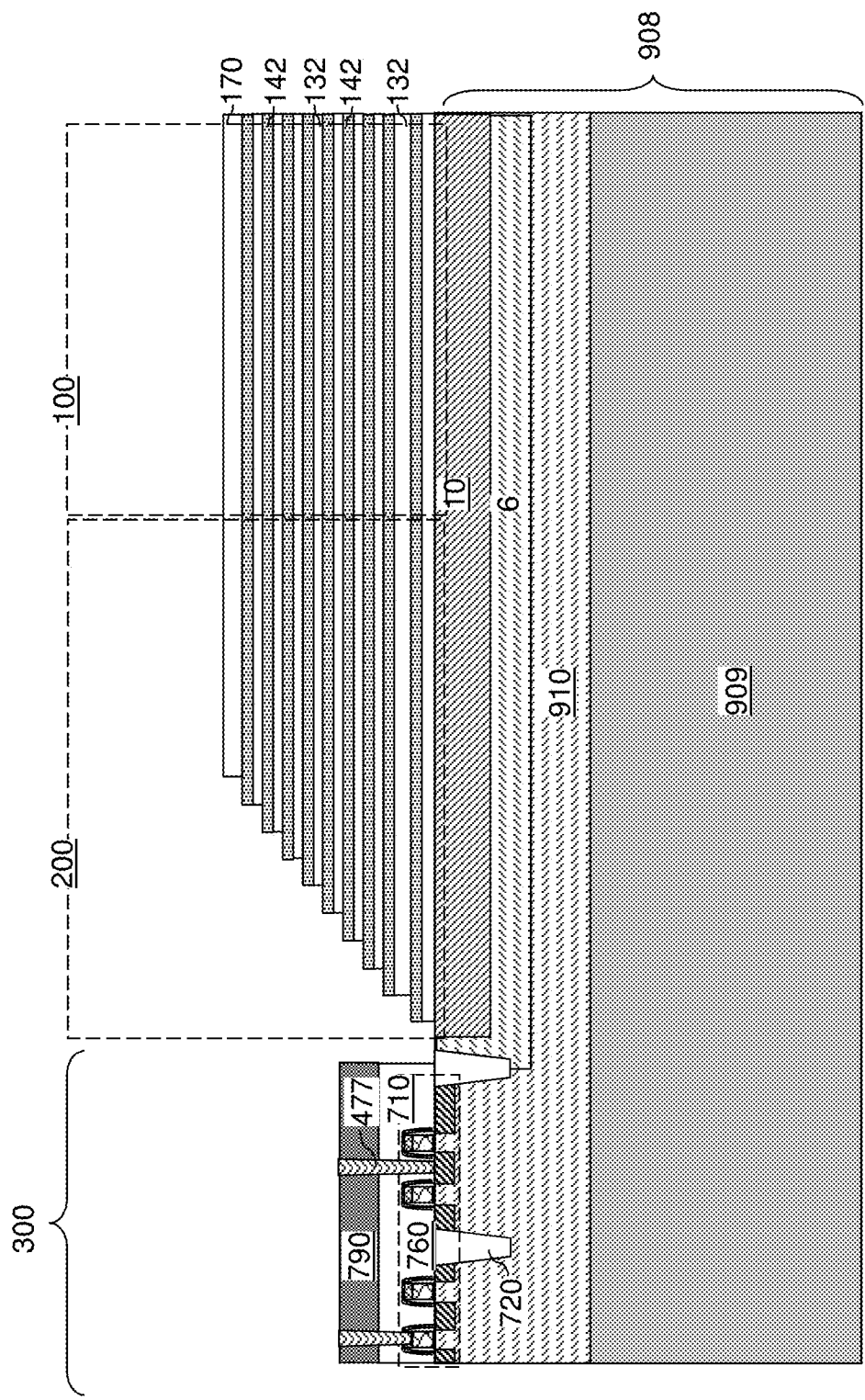
FIG. 2 is a vertical cross-sectional view of a region of the exemplary structure after formation of a first-tier alternating stack of first insulating layers and first spacer material layers and after patterning a first-tier staircase region according to an embodiment of the present disclosure.

Referring to FIG. 2, the etch stop dielectric layer 790 and the planarization dielectric layer 760 can be removed from each memory array region 100 and from each staircase region 200. For example, a photoresist layer (not shown) can cover each area including the semiconductor devices 710, and portions of the etch stop dielectric layer 790 and the planarization dielectric layer 760 that are not covered by the photoresist layer can be removed by at least one etch process, which may include an isotropic etch process (such as a wet etch process) and/or an anisotropic etch process (such as a reactive ion etch process). A top surface of the substrate 908 (such as a top surface of a second doped well 10) can be physically exposed within a memory array region 100 and adjacent staircase regions 200.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the substrate 908. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

The first insulating cap layer 170 and the first-tier alternating stack (132, 142) may be patterned to form first stepped surfaces in the staircase region 200. Each layer of the first-tier alternating stack (132, 142) can be removed from above the etch stop dielectric layer 790. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

The first insulating layers 132 and the first sacrificial material layers 142 continuously extend over an entire area of a memory array region 100, and thus, are also referred to as first continuous insulating layers and first continuous sacrificial material layers, respectively. A vertically alternating sequence of the first continuous insulating layers and the first continuous sacrificial material layers can be formed over the substrate 908. The first stepped surfaces are formed at peripheral portions of the vertically alternating sequence. Each layer of the vertically alternating sequence is present within the memory array region 100. The lateral extent of the first continuous sacrificial material layers decreases with a vertical distance from the substrate 908 in each staircase region 200. In one embodiment, all layers of the vertically alternating sequence are removed from above the etch stop dielectric layer 790, and the stepped surfaces of the remaining portions of the vertically alternating sequence do not extend to areas in which the etch stop dielectric layer 790 is present.

Figure 3:
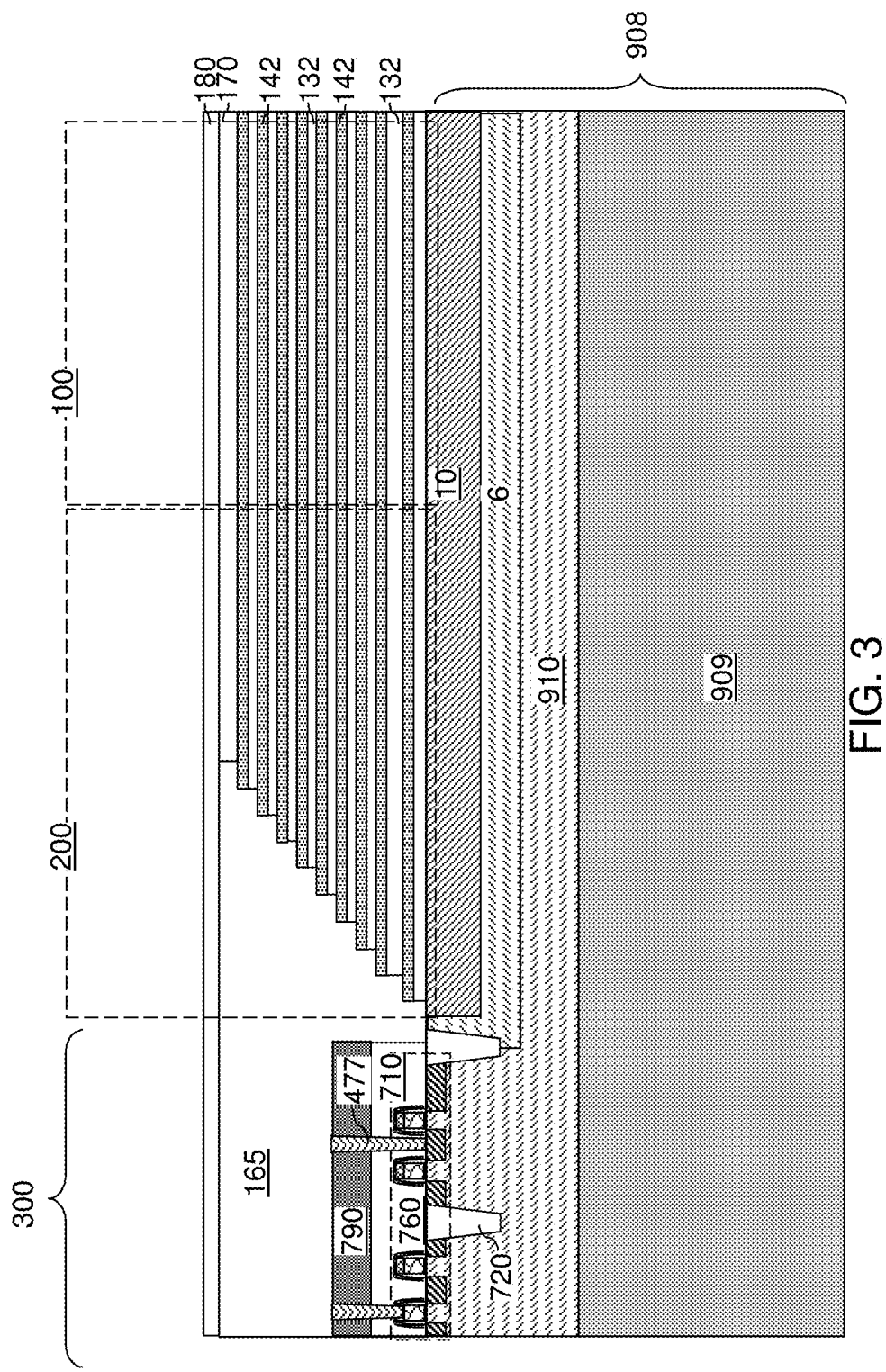
FIG. 3 is a vertical cross-sectional view of a region of the exemplary structure after formation of a first retro-stepped dielectric material portion and an inter-tier dielectric layer according to an embodiment of the present disclosure.

Referring to FIG. 3, a dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first retro-stepped dielectric material portion overlies, and contacts, the etch stop dielectric layer 790. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
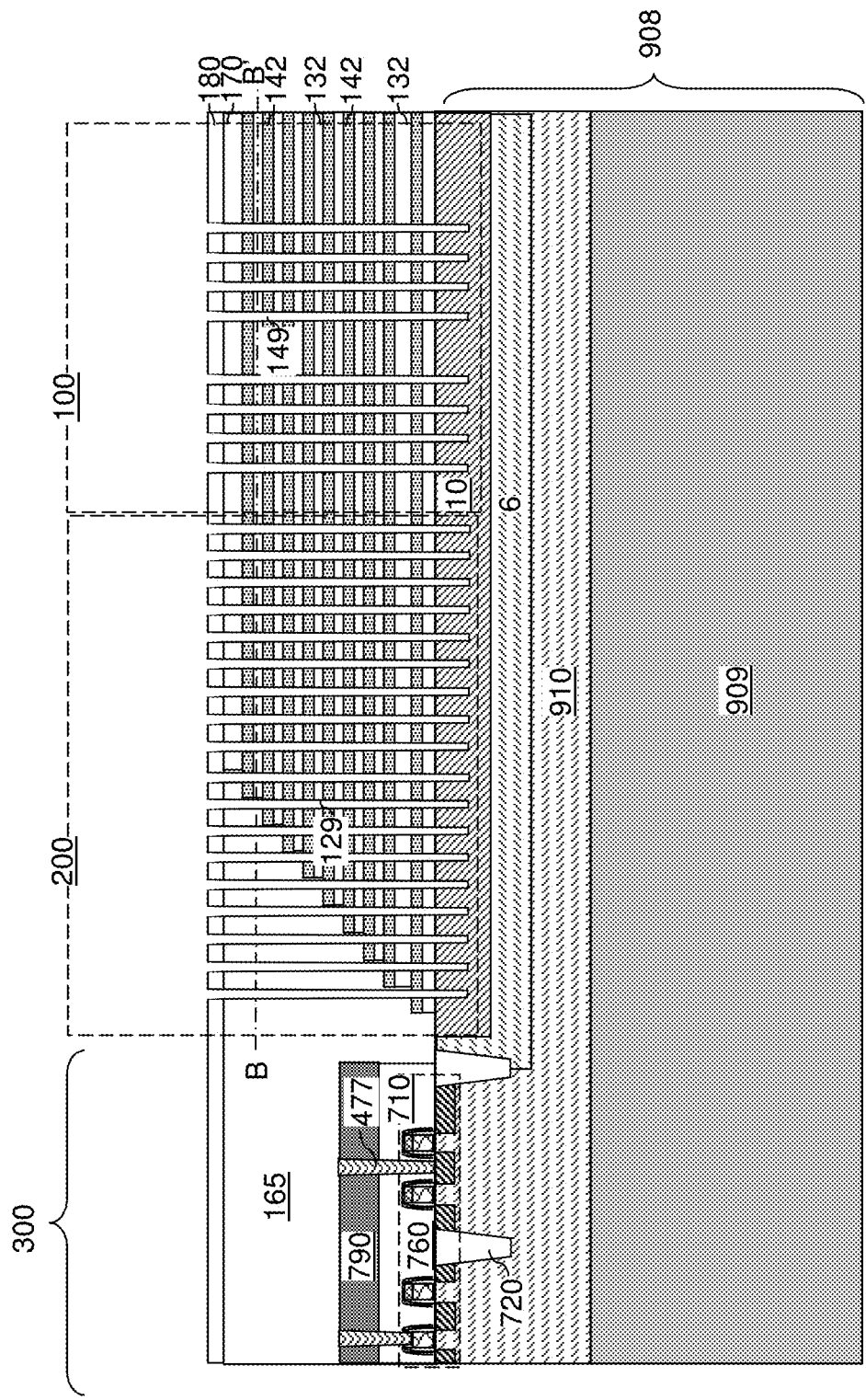
FIG. 4A is a vertical cross-sectional view of a region of the exemplary structure after formation of first-tier memory openings and first-tier support openings according to an embodiment of the present disclosure.
Figure 4B:
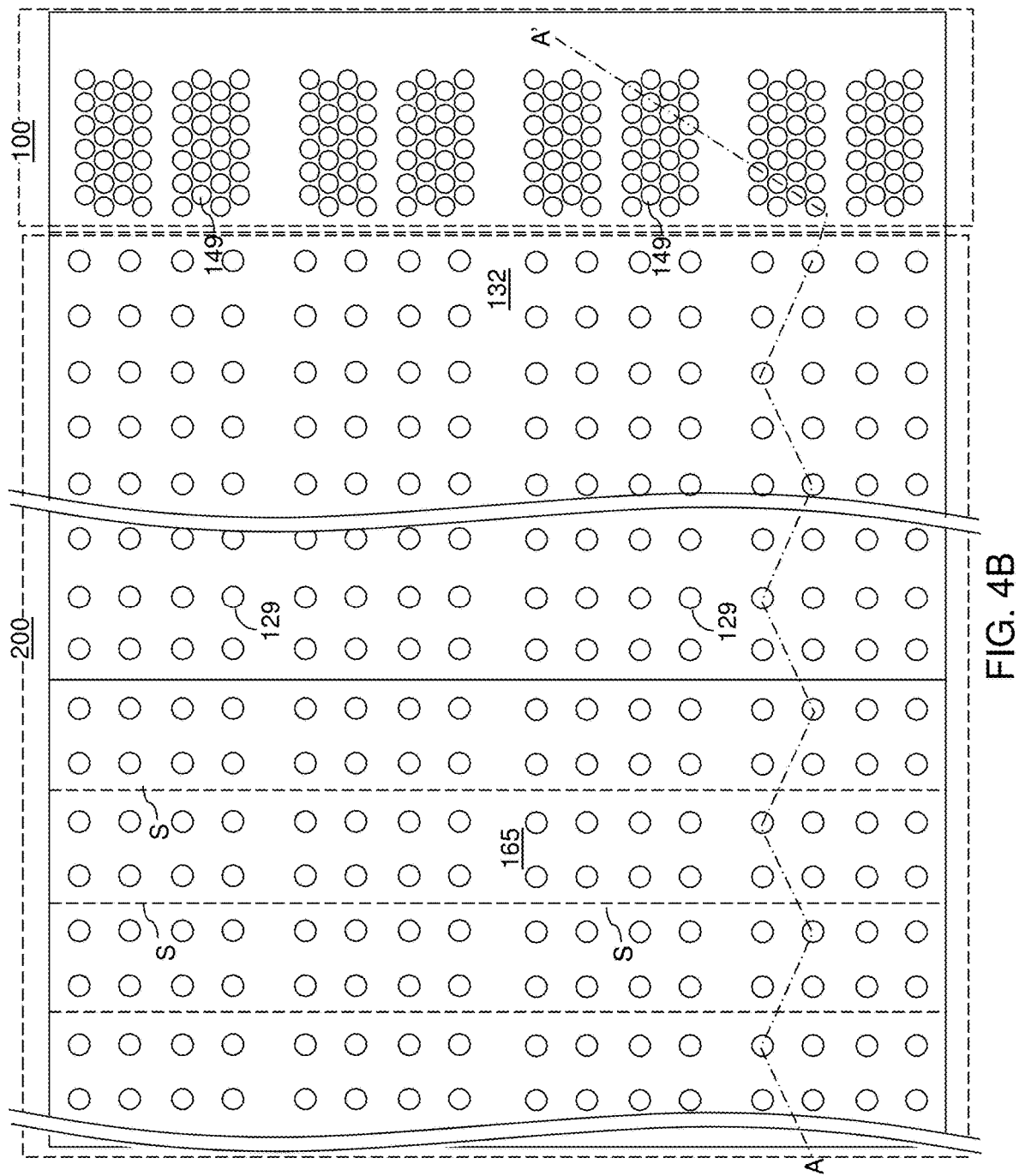
FIG. 4B is a horizontal cross-sectional view of a region of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the substrate 908. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the substrate 908 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. In one embodiment, the terminal portion of the anisotropic etch process may include an overetch step that etches into an upper portion of the second doped well 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer

180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
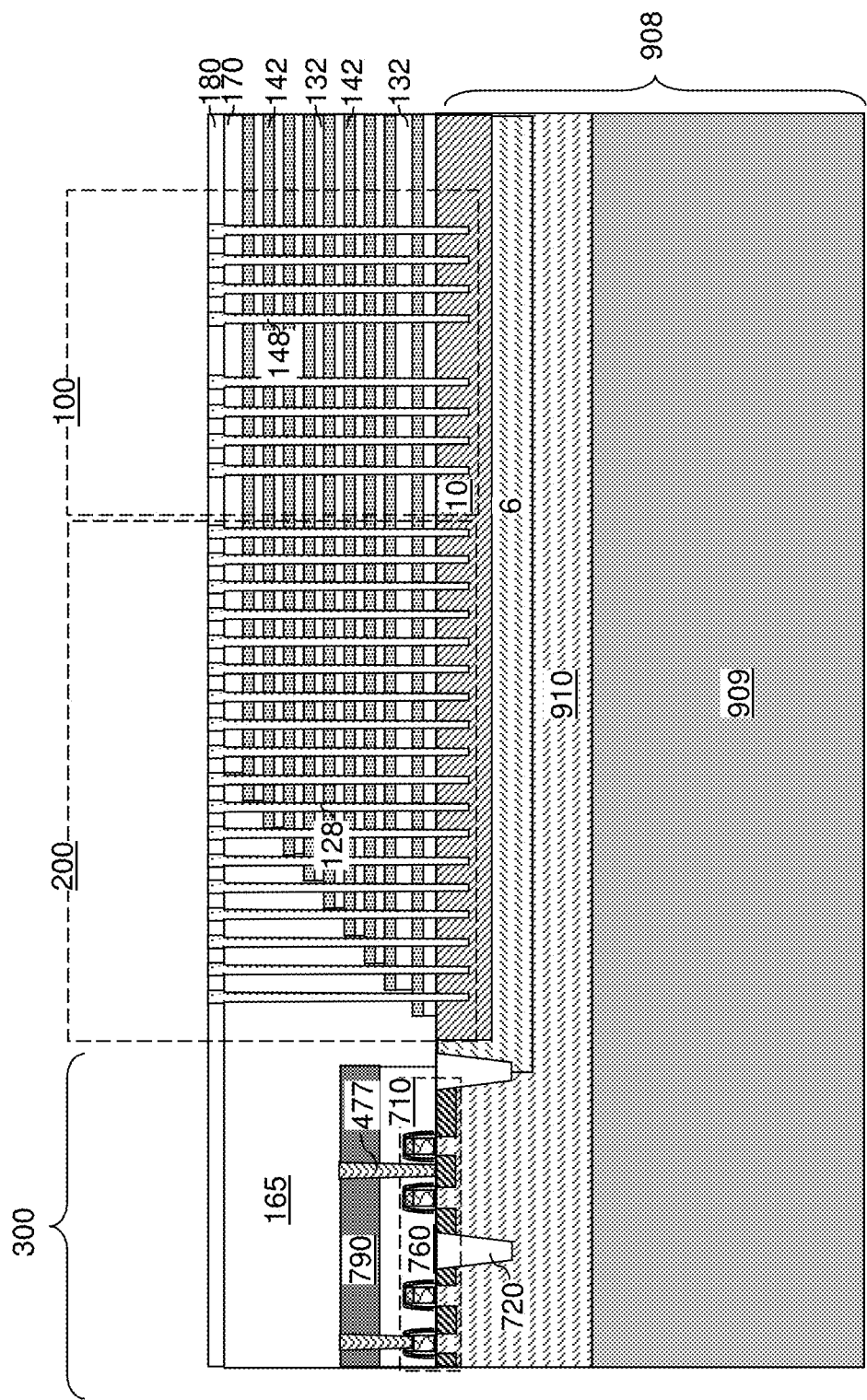
FIG. 5 is a vertical cross-sectional view of a region of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include an amorphous carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
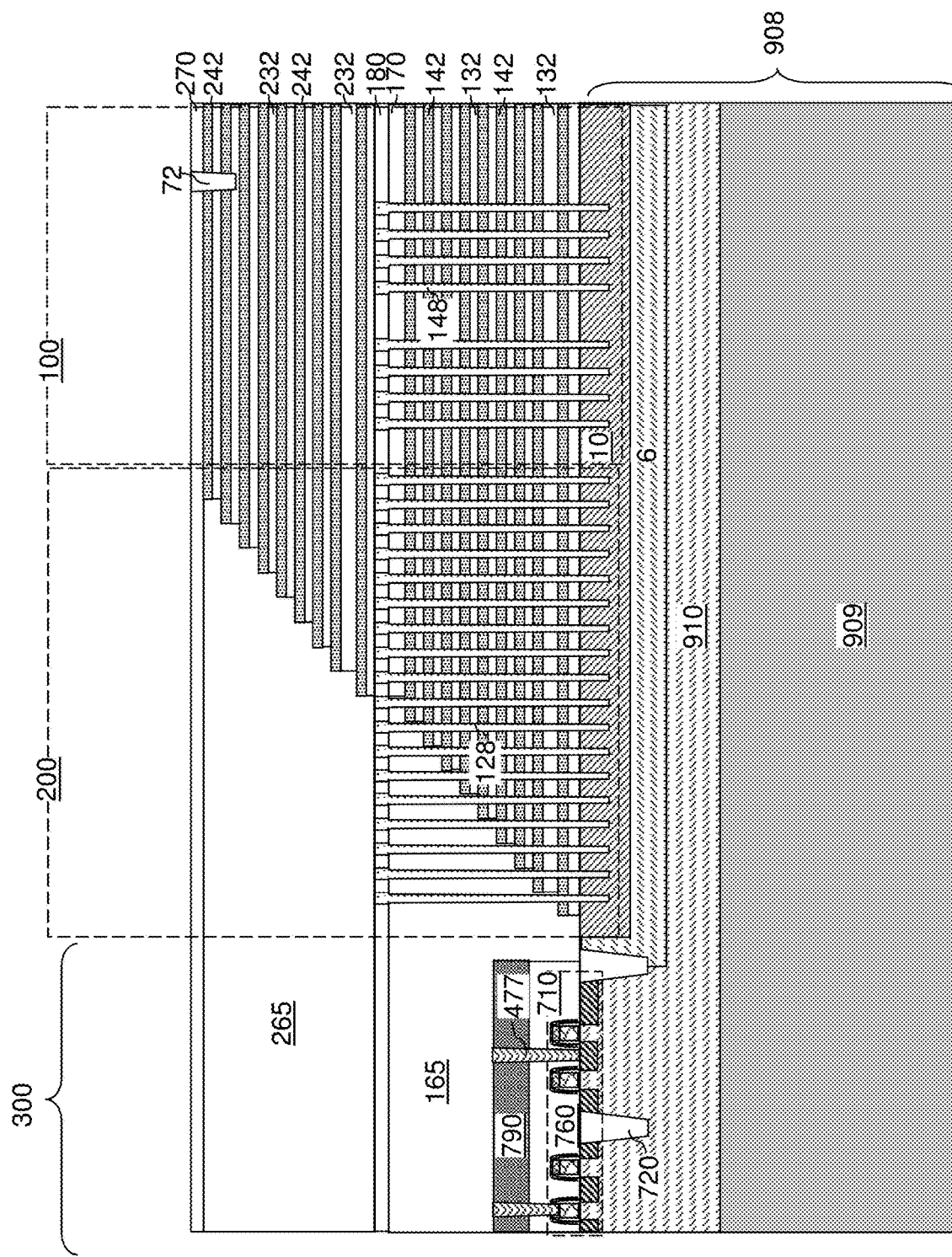
FIG. 6 is a vertical cross-sectional view of a region of the exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132.

The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

The second insulating layers 232 and the second sacrificial material layers 242 continuously extend over an entire area of a memory array region 100, and thus, are also referred to as second continuous insulating layers and second continuous sacrificial material layers, respectively. A vertically alternating sequence of the second continuous insulating layers and the second continuous sacrificial material layers can be formed over the substrate 908. The second stepped surfaces are formed at peripheral portions of the vertically alternating sequence. Each layer of the vertically alternating sequence is present within the memory array region 100. The lateral extent of the second continuous sacrificial material layers 242 decreases with a vertical distance from the substrate 908 in each staircase region 200. In one embodiment, all layers of the vertically alternating sequence are removed from above the etch stop dielectric layer 790, and the stepped surfaces of the remaining portions of the vertically alternating sequence do not extend to areas in which the etch stop dielectric layer 790 is present.

Generally speaking, at least one vertically alternating sequence of continuous insulating layers (132, 232) and continuous spacer material layers (such as continuous sacrificial material layers (142, 242)) may be formed over the substrate 908, and at least one stepped dielectric material portion (165, 265) may be formed over the staircase regions on the at least one vertically alternating sequence (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
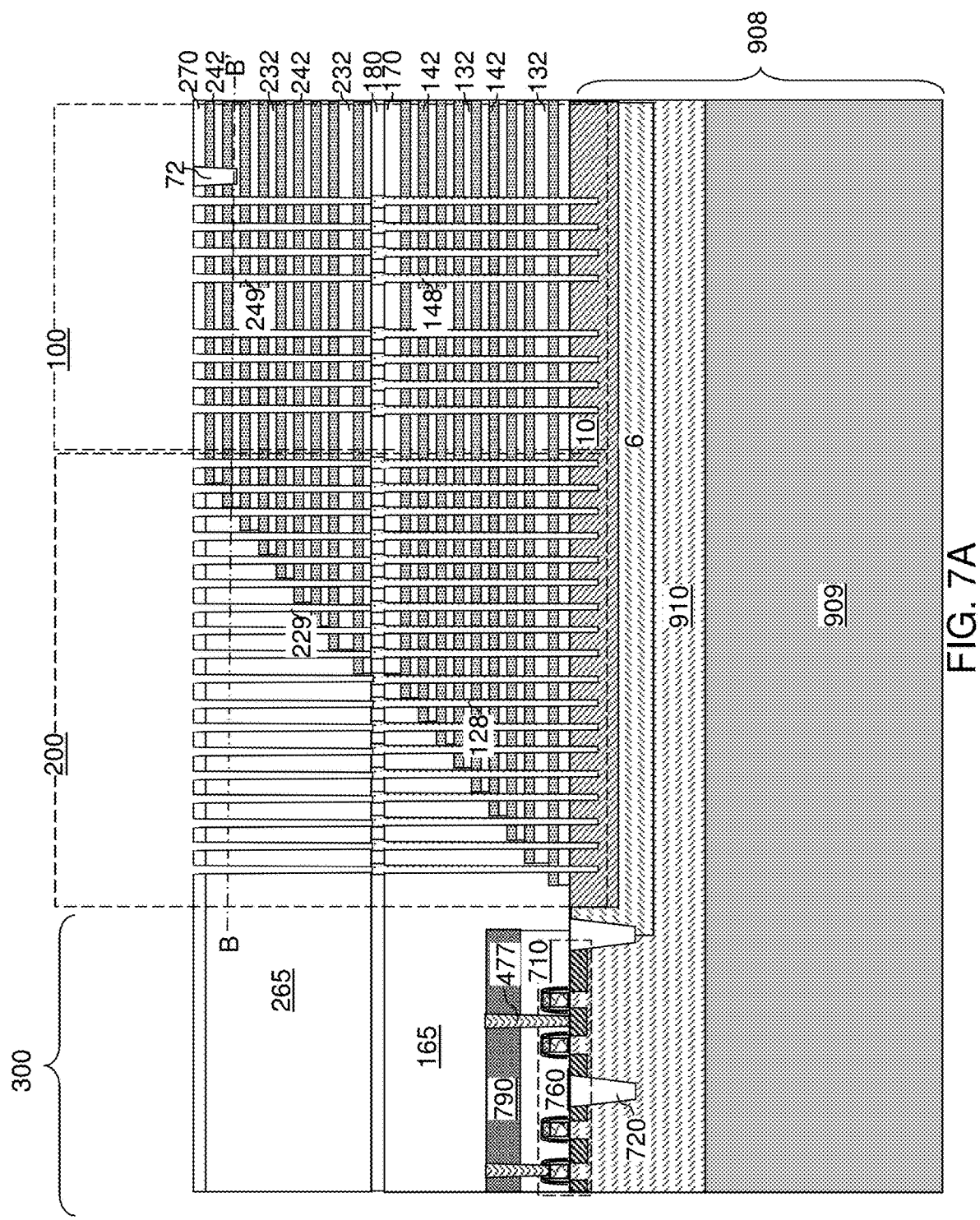
FIG. 7A is a vertical cross-sectional view of a region of the exemplary structure after formation of second-tier memory openings and second-tier support openings according to an embodiment of the present disclosure.
Figure 7B:
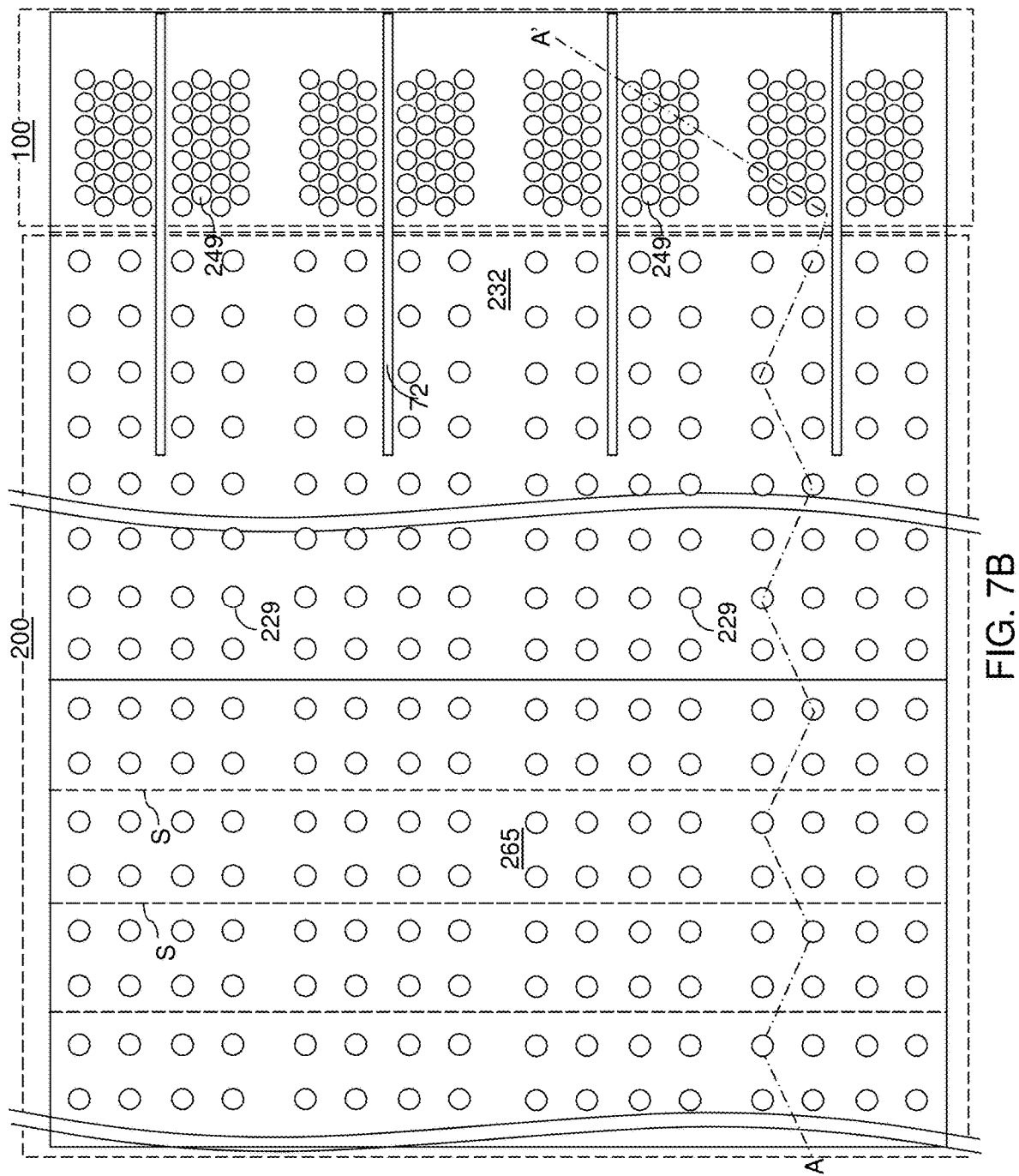
FIG. 7B is a horizontal cross-sectional of a region of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the second-tier memory openings 249 in the memory array region 100 may be the same as the pattern of the first-tier memory openings 149, which is the same as the pattern of the first-tier memory opening fill portion 148. The lateral extent of the pattern of the second-tier support openings 229 in the staircase region 200 can be limited within the areas of the stepped surfaces of the second-tier alternating stack (232, 242). In other words, the second-tier support openings 229 may be absent within an area in which the second retro-stepped dielectric material portion 265 contacts a top surface of the inter-stack dielectric layer 180. Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
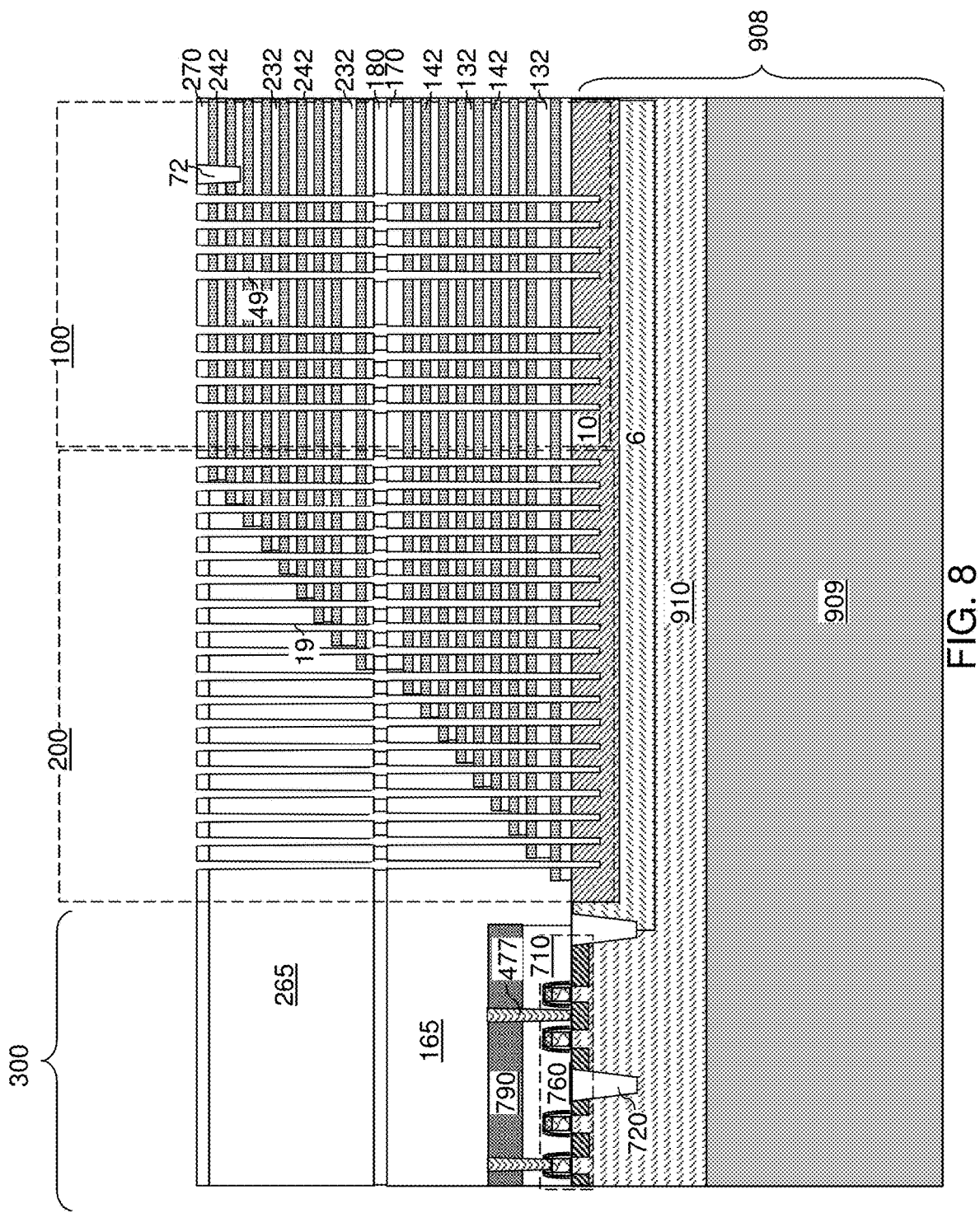
FIG. 8 is a vertical cross-sectional view of a region of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the second doped well 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the second doped well 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art.

In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/\text{cm}^3$ to $1.0 \times 10^{18}/\text{cm}^3$, such as from $1.0 \times 10^{14}/\text{cm}^3$ to $1.0 \times 10^{17}/\text{cm}^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/\text{cm}^3$ to $1.0 \times 10^{19}/\text{cm}^3$, such as from $1.0 \times 10^{16}/\text{cm}^3$ to $1.0 \times 10^{18}/\text{cm}^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/\text{cm}^3$ to $2.0 \times 10^{21}/\text{cm}^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The semiconductor material layer 910 and doped wells embedded therein, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
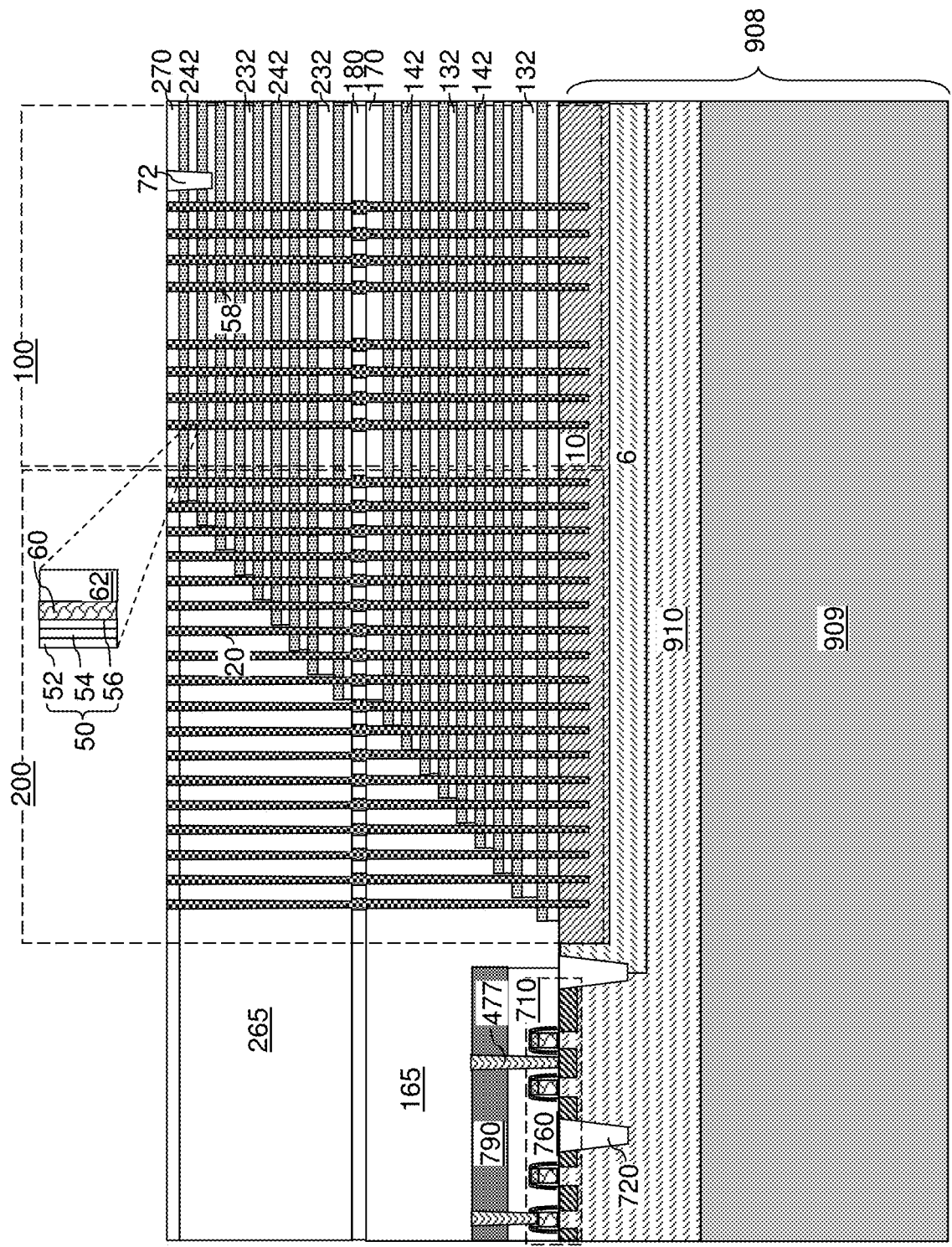
FIG. 10 is a vertical cross-sectional view of a region of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. Generally, a plurality of sets of memory stack structures 55 can be formed through the vertically alternating sequence of the first continuous insulating layers 132 and the first continuous sacrificial material layers 142 and through the vertically alternating sequence of the second continuous insulating layers 232 and the second continuous sacrificial material layers 242. The first continuous insulating layers 132 and the second continuous insulating layers 232 can be considered as a set of continuous insulating layers (132, 232) and a set of continuous sacrificial material layers (142, 242). Thus, each set of memory stack structures 55 can vertically extend through the vertically alternating sequence of the continuous insulating layers (132, 232) and the continuous sacrificial material layers (142, 242). Each set of memory stack structures 55 vertically extends through a respective region of the vertically alternating sequence that are laterally spaced apart along the second horizontal direction hd2. Each of the memory stack structures 55 comprises a respective vertical semiconductor channel 60 and a respective memory film 60.

Figure 11A:
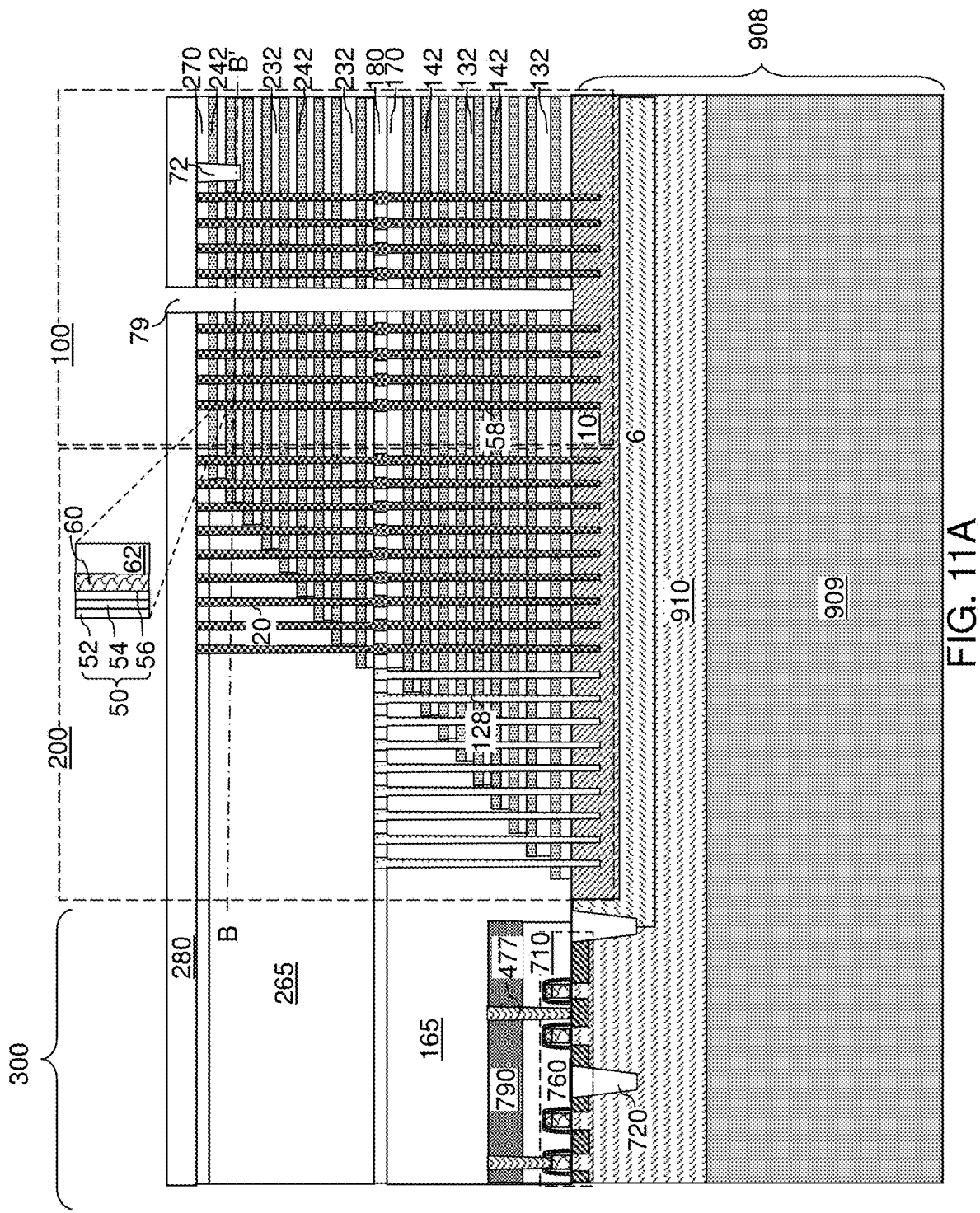
FIG. 11A is a vertical cross-sectional view of a region of the exemplary structure after formation of a contact-level dielectric layer and divider trenches according to an embodiment of the present disclosure.
Figure 11B:
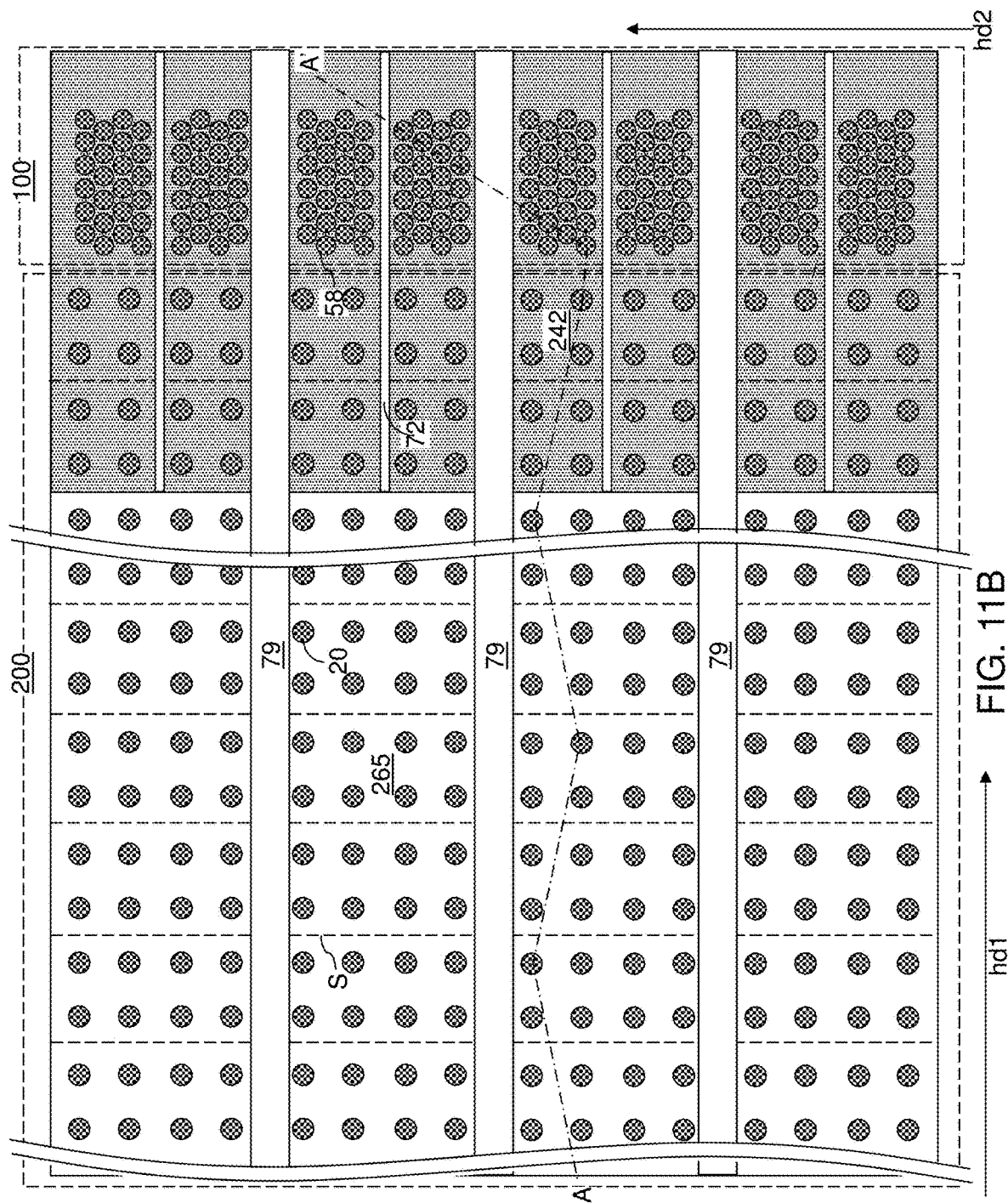
FIG. 11B is a horizontal cross-sectional of a region of the exemplary structure along the horizontal plane B-B' of FIG. 11A. The hinged vertical plane A-A' corresponds to the plane of the vertical cross-sectional view of FIG. 11A.
Figure 11C:
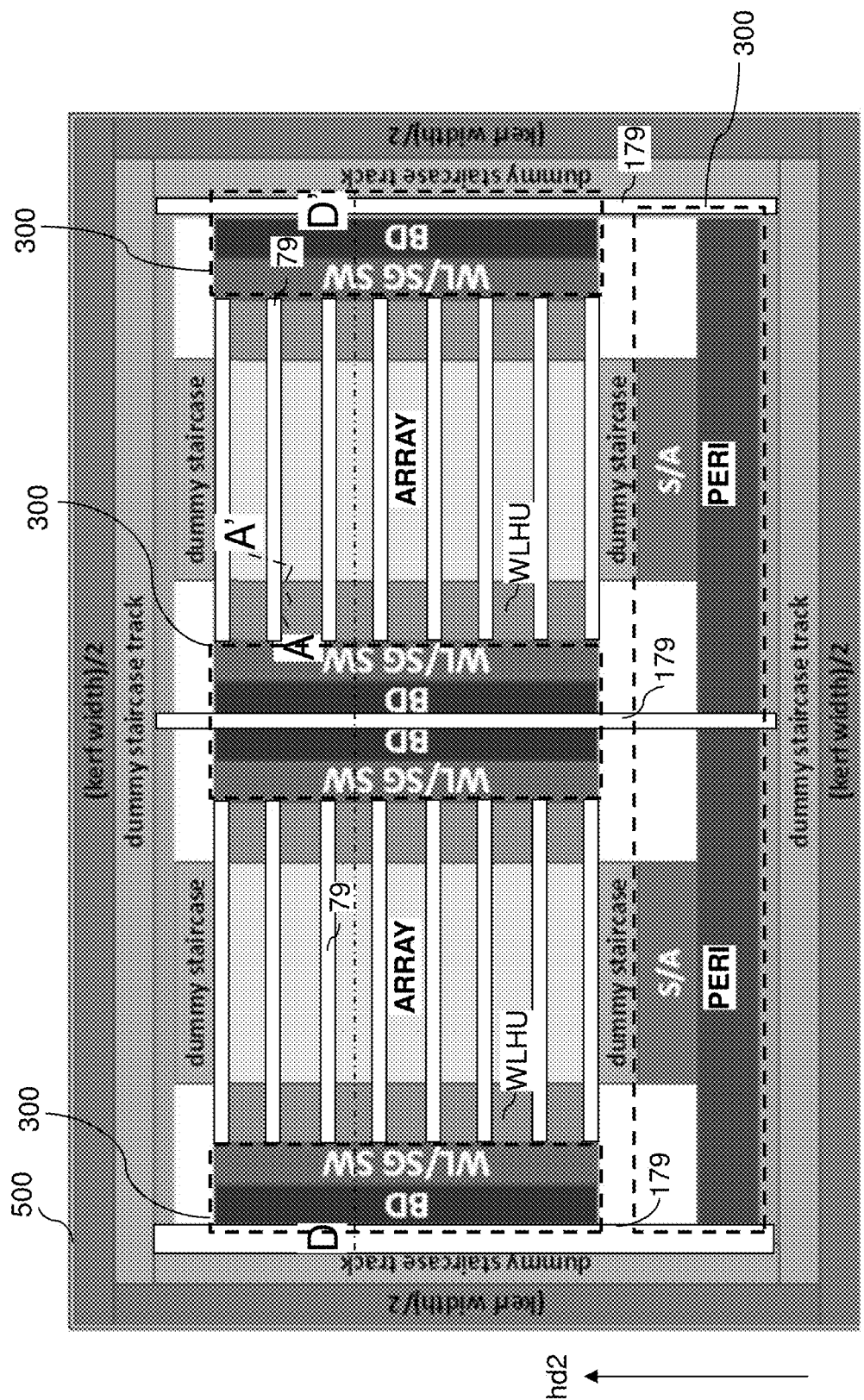
FIG. 11C is a top-down view of a unit die area of the exemplary structure of FIGS. 11A-11D. The hinged vertical plane A-A' corresponds to the plane of the vertical cross-sectional view of FIG. 11A.
Figure 11D:
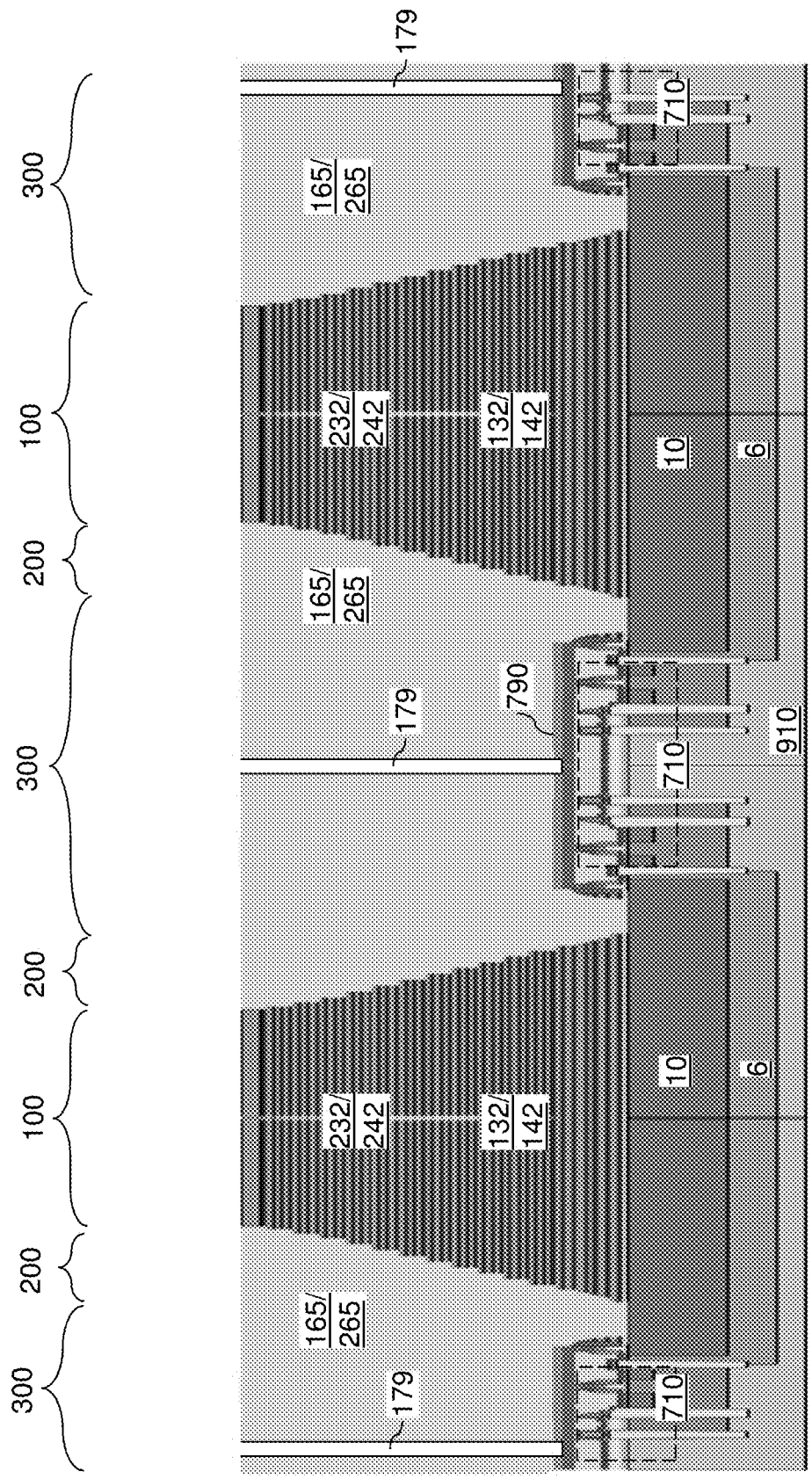
FIG. 11D is a vertical cross-sectional view of the exemplary structure along the vertical plane D-D' of FIG. 11C.
Figure 11E:
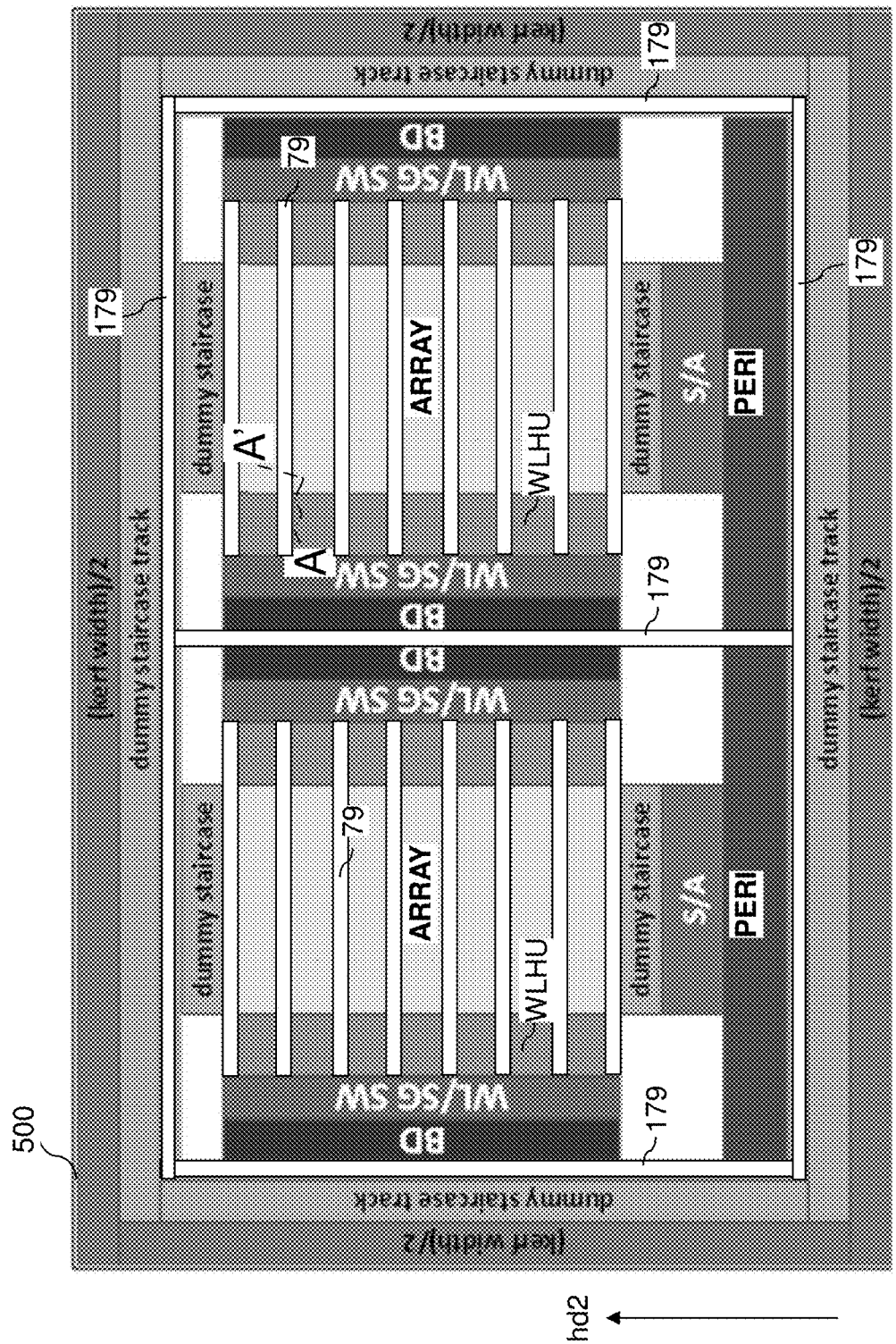
FIG. 11E is a top-down view of a unit die area of a first alternative embodiment of the exemplary structure of FIGS. 11A-11D.
Figure 11F:
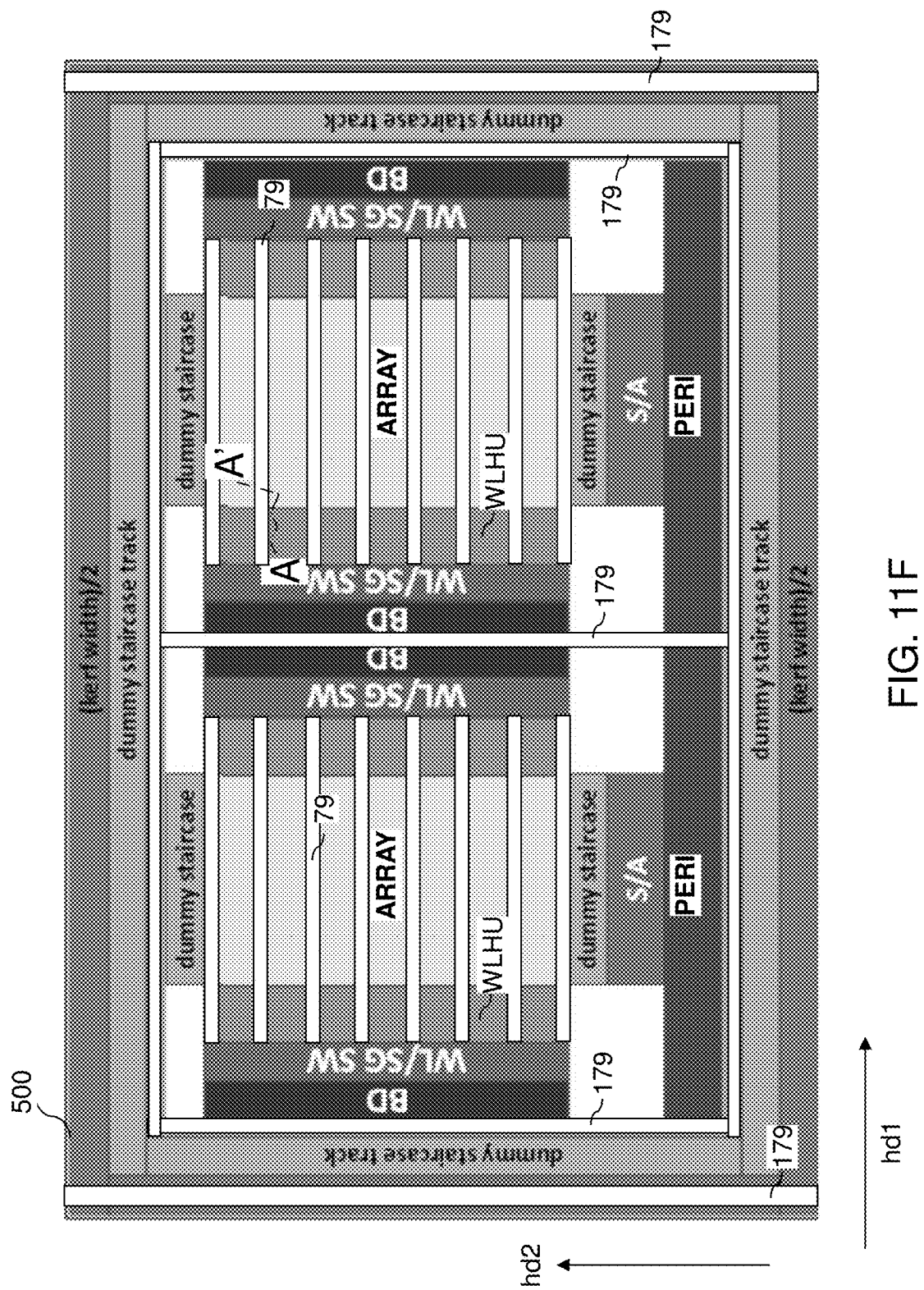
FIG. 11F is a top-down view of a unit die area of a second alternative embodiment of the exemplary structure of FIGS. 11A-11D.

Referring to FIGS. 11A-11F, various views of the exemplary structure are illustrated after formation of a contact-level dielectric layer 280, divider trenches 79, and slit trenches 179. FIGS. 11A-11D illustrate a configuration of the exemplary structure. FIG. 11E illustrates a first alternative embodiment of the exemplary structure of FIGS. 11A-11D. FIG. 11F illustrates a second alternative embodiment of the exemplary structure of FIGS. 11A-11D. The first alternative embodiment and the second alternative embodiment are different from the structure illustrated in FIGS. 11A-11D by the presence of additional slit trenches 179.

Specifically, a contact-level dielectric layer 280 may be formed over the second-tier structure (232, 242, 270, 265, 72). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280 and may be lithographically patterned to form elongated openings that extend along the first horizontal direction hd1 between clusters of memory opening fill structures 58. As shown in FIGS. 11C and 11D, the divider trenches 79 and the slit trenches 179 may be formed by transferring the pattern in the photoresist layer through the contact-level dielectric layer 280, the second-tier structure (232, 242, 270, 265, 72), and the first-tier structure (132, 142, 170, 165), and to a top surface of the substrate 908. As used herein, a "divider trench" refers to a trench that laterally divides the vertically alternating sequence of the continuous insulating layers (132, 232) and the continuous sacrificial material layers (142, 242) into a plurality of memory blocks. As used herein, a "slit trench" refers to a trench having a shape of a slit. In one embodiment, the slit trenches 179 can be formed outside the areas of the vertically alternating sequence of the continuous insulating layers (132, 232) and the continuous sacrificial material layers (142, 242) (i.e., outside the memory array region 100). Portions of the contact-level dielectric layer 280, the second-tier structure (232, 242, 270, 265, 72), the first-tier structure (132, 142, 170, 165), and the substrate 908 that underlie the openings in the photoresist layer may be removed to form the divider trenches 79. Portions of the contact-level dielectric layer 280, the second insulating cap layer 270, the second retro-stepped dielectric material portion 265, the inter-tier dielectric layer 180, and the first retro-stepped dielectric material portion 165 that underlie the openings in the photoresist layer may be removed to form the slit trenches 179.

The anisotropic etch process that forms the divider trenches 79 and the slit trenches 179 may stop on the etch stop dielectric layer 790. Thus, the planarization dielectric layer 760 and underlying semiconductor devices 710 can be protected from the anisotropic etch process by remaining portions of the etch stop dielectric layer 790. Each divider trench 79 can vertically extend from the top surface of the contact-level dielectric layer 280 to a top surface of the substrate 908 (such as a top surface of the second doped well 10). At least one slit trench 179 can vertically extend from the top surface of the contact-level dielectric layer 280 to a surface of the etch stop dielectric layer 790, which may be a recessed horizontal surface of the etch stop dielectric layer 790. In one embodiment, one or more slit trenches 179 may be formed in the peripheral region 300, such as in an overlying bit line drivers and a space between sense amplifiers, as shown in FIGS. 11C and 11D. In another embodiment, one or more slit trenches 179 may be formed in an area in which the etch stop dielectric layer 790 is not present. For example, the slit trenches 179 may be formed in the kerf areas 500 (outside of the area of a semiconductor die) as illustrated in FIG. 11F.

In one embodiment, the divider trenches 79 may be formed between clusters (e.g., memory blocks of memory stack structures 55. According to an embodiment of the present disclosure, the divider trenches 79 can laterally extend along the first horizontal (e.g., word line) direction hd1, and divide the vertically alternating sequence into a plurality of alternating stacks of insulating layers (132, 232) and sacrificial material layers (142, 242). Each alternating stack of insulating layers (132, 232) and sacrificial material layers (142, 242) can include a first-tier alternating stack of first insulating layers 132 and first sacrificial material layers 142, and a second-tier alternating stack of second insulating layers 232 and second sacrificial material layers 242. The clusters of the memory stack structures 55 may be laterally spaced apart along the second horizontal (e.g., bit line) direction hd2 by the divider trenches 79.

According to an aspect of the present disclosure, all slit trenches 179 or a subset of the slit trenches 179 laterally extend along the second horizontal direction hd2, which is perpendicular to the first horizontal direction hd1 along which the divider trenches 79 laterally extend. The alignment of the lengthwise direction of the subset of the slit trenches 179 to the direction that is perpendicular to the lengthwise direction of the divider trenches 79 compensates for the one directional stress generated by the divider trenches 79 and to be subsequently generated by electrically conductive layers (e.g., word lines) that will replace the sacrificial material layers (142, 242). Specifically, the electrically conductive layers that subsequently replace the sacrificial material layers (142, 242) laterally extend along the lengthwise direction, which is the first horizontal direction, and is laterally spaced apart by divider trench fill structures that fill the divider trenches 79. The material(s) of the divider trench fill structures can absorb a component of the mechanical stress applied along the second horizontal direction hd2 by the electrically conductive layers. However, the material(s) of the divider trench fill structures do not absorb a component of the mechanical stress applied along the first horizontal direction hd1 by the electrically conductive layers. The lengthwise direction of the slit trenches 179 along the second horizontal direction hd2 allows slit trench fill structures to absorb the component of the mechanical stress applied along the first horizontal direction hd1 by the electrically conductive layers, and to reduce or eliminate warpage of the substrate 908 and devices structures formed thereupon.

In one embodiment, the slit trenches 179 do not contact the plurality of alternating stacks of insulating layers (132, 232) and sacrificial material layers (142, 242). In one embodiment, at least one of the slit trenches 179 can be formed through the first retro-stepped dielectric material portion 165 and the second retro-stepped dielectric material portion 265, and can vertically extend from the top surface of the contact-level dielectric layer 280 to a surface of the etch stop dielectric layer 290.

In one embodiment, an additional subset of the slit trenches 179 can laterally extend along the first horizontal direction hd1, as illustrated in FIGS. 11E and 11F. The additional subset of the slit trenches 179 can be located outside the areas of the alternating stacks {(132, 142), (232, 2342)} outside the memory array region 100, and may, or may not, be connected to a slit trench 179 that laterally extends along the second horizontal direction hd2.

In one embodiment, at least one of the slit trenches 179 can be formed in the kerf area 500 as illustrated in FIG. 11F. The kerf area can be located outside the outer periphery of a seal ring structure in region 400 to be subsequently formed.

In one embodiment, each alternating stack {(132, 142), (232, 2342)} of the plurality of alternating stacks {(132, 142), (232, 2342)} comprises a respective staircase region 200 in which spacer material layers (142, 242) have lateral extents that decrease with an increase in a vertical distance from the substrate 908. In one embodiment, each of the plurality of slit trenches 179 can be located outside an area of, and is not adjoined to, the plurality of divider trenches 79.

In one embodiment, each of the plurality of divider trenches 79 can be laterally bounded by sidewalls of at least one alternating stack {(132, 142), (232, 2342)}. A first subset of the diver trenches 79 may laterally extend along the first horizontal direction hd1 between a pair of alternating stacks {(132, 142), (232, 2342)}. A second subset of the diver trenches 79 may laterally extend along the first horizontal direction hd1 adjacent to an outermost one of alternating stacks {(132, 142), (232, 2342)}. In one embodiment, the plurality of slit trenches 179 do not directly contact any of the plurality of alternating stacks {(132, 142), (232, 2342)} of insulating layers (132, 232) and spacer material layers (142, 242).

In one embodiment, a first plurality of alternating stacks of insulating layers (132, 232) and spacer material layers (142, 242) can be provided in a first memory array region 100 (e.g., first memory plane), and a second plurality of alternating stacks of insulating layers (132, 232) and spacer material layers (142, 242) can be provided in a second memory array region 100 (e.g., first memory plane) that is laterally spaced apart from the first memory array region 100. In one embodiment, one of the plurality of slit trenches 179 can be located between the first plurality of alternating stacks and the second plurality of alternating stacks in the peripheral region 300 located between the memory array regions 100. In one embodiment, each of the slit trenches 179 has a rectangular horizontal cross-sectional area with a length-to-width ratio greater than 30.

Figure 12:
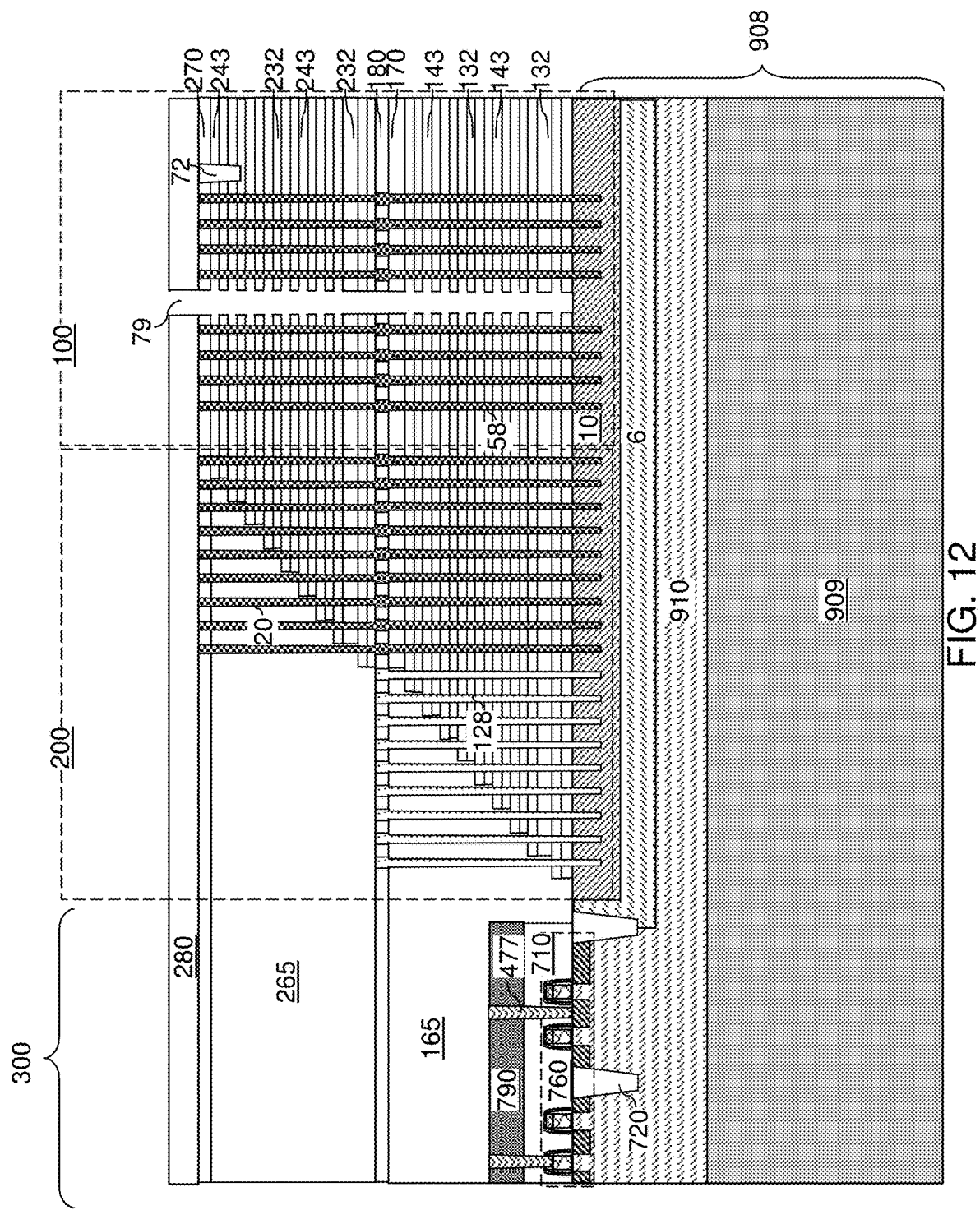
FIG. 12 is a vertical cross-sectional view of a region of the exemplary structure after formation of backside recesses according to an embodiment of the present disclosure.

Referring to FIG. 12, the sacrificial material layers (142, 242) are may be removed selective to the insulating layers (132, 232), the first and second insulating cap layers (170, 270), the contact-level dielectric layer 280, and the substrate 908. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the divider trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the divider trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. The slit trenches 179 do not contact any alternating stack {(132, 142), (232, 242)}, and thus, the slit trenches 179 are not laterally expanded during the isotropic etch process.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
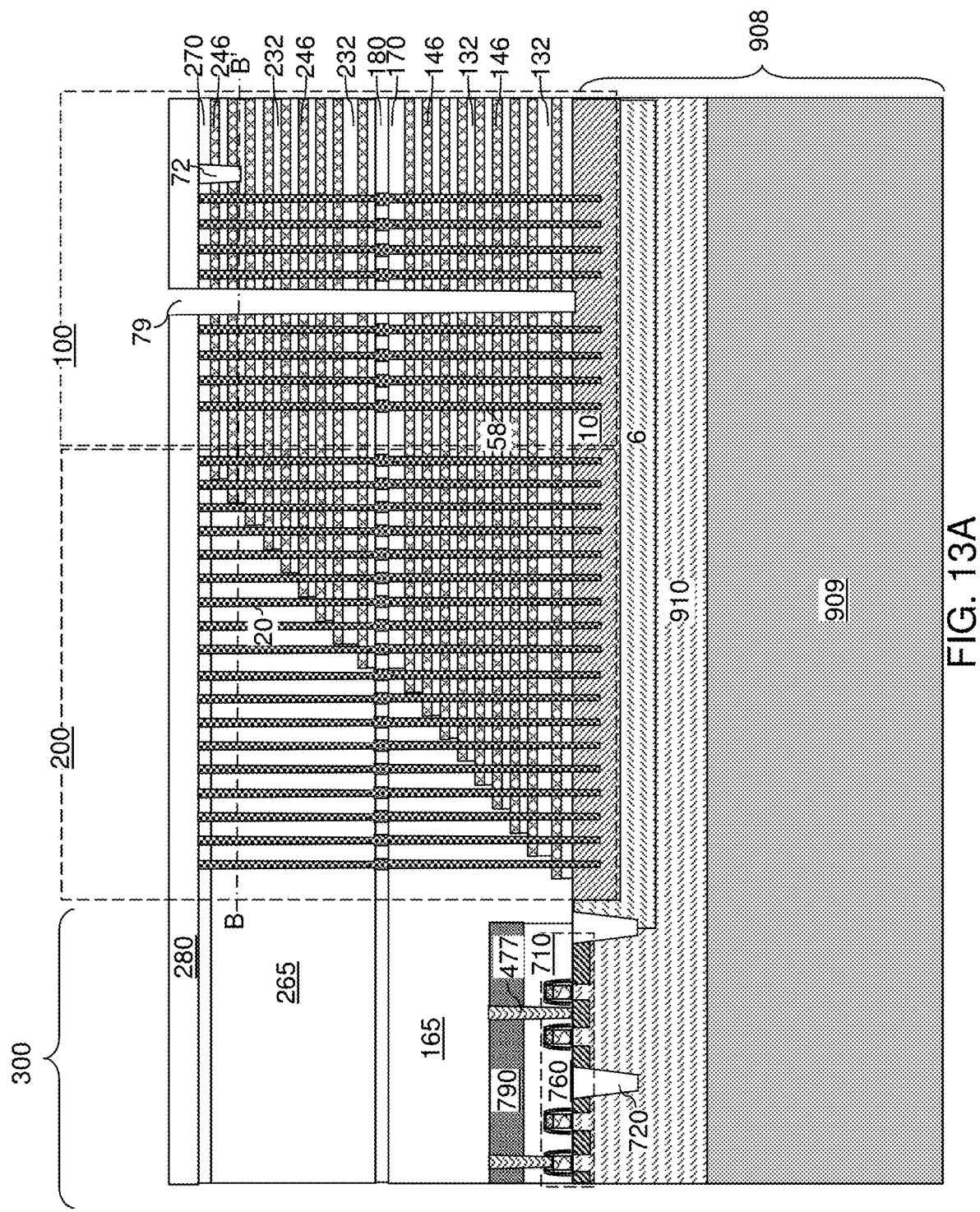
FIG. 13A is a vertical cross-sectional view of a region of the exemplary structure after formation of electrically conductive layers according to an embodiment of the present disclosure.
Figure 13B:
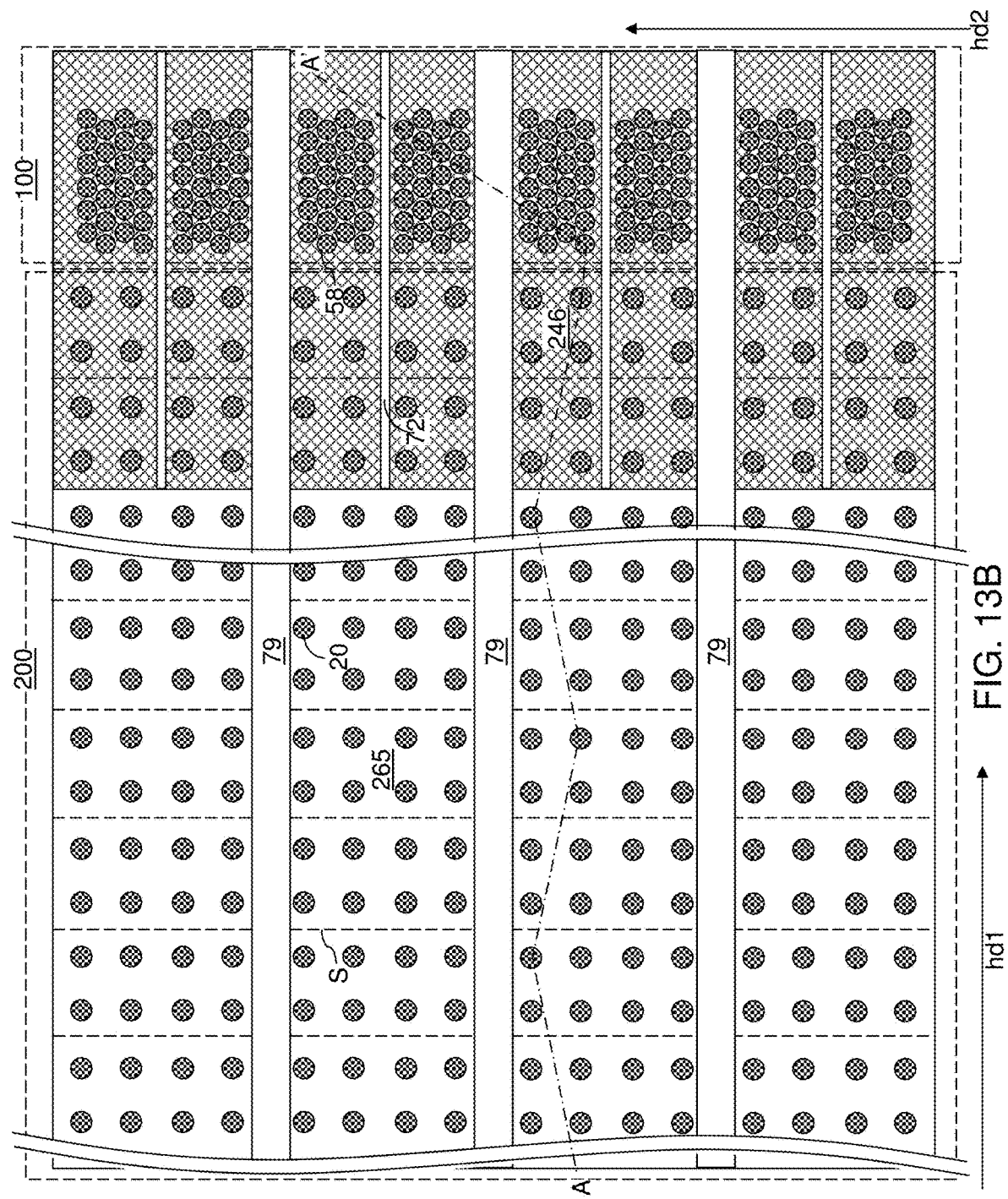
FIG. 13B is a horizontal cross-sectional of a region of the exemplary structure along the horizontal plane B-B' of FIG. 13A. The hinged vertical plane A-A' corresponds to the plane of the vertical cross-sectional view of FIG. 13A.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the divider trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the divider trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each divider trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each divider trench 79 that is not filled with the continuous metallic material layer.

Residual conductive material may be removed from inside the divider trenches 79. Specifically, the deposited metallic material of the continuous metallic material layer may be etched back from the sidewalls of each divider trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective divider trench 79. The divider trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the semiconductor substrate layer 909. The memory-level assembly includes at least one alternating stack (132, 146, 232, 246) and memory stack structures 55 vertically extending through the at least one alternating stack (132, 146, 232, 246).

Generally, the sacrificial material layers (142, 242) in the plurality of alternating stacks {(132, 142), (232, 242)} can be replaced with the electrically conductive layers (146, 246) employing the divider trenches 79 as a conduit for an etchant that etches the sacrificial material layers (142, 242) and for a reactant that deposits at least one conductive material of the electrically conductive layers (146, 246). A plurality of alternating stacks of insulating layers (132, 232) and electrically conductive layers (146, 246) can be located on a substrate 908, and can be laterally spaced apart by a plurality of divider trenches 79 that laterally extend along the first horizontal direction hd1.

Figure 14A:
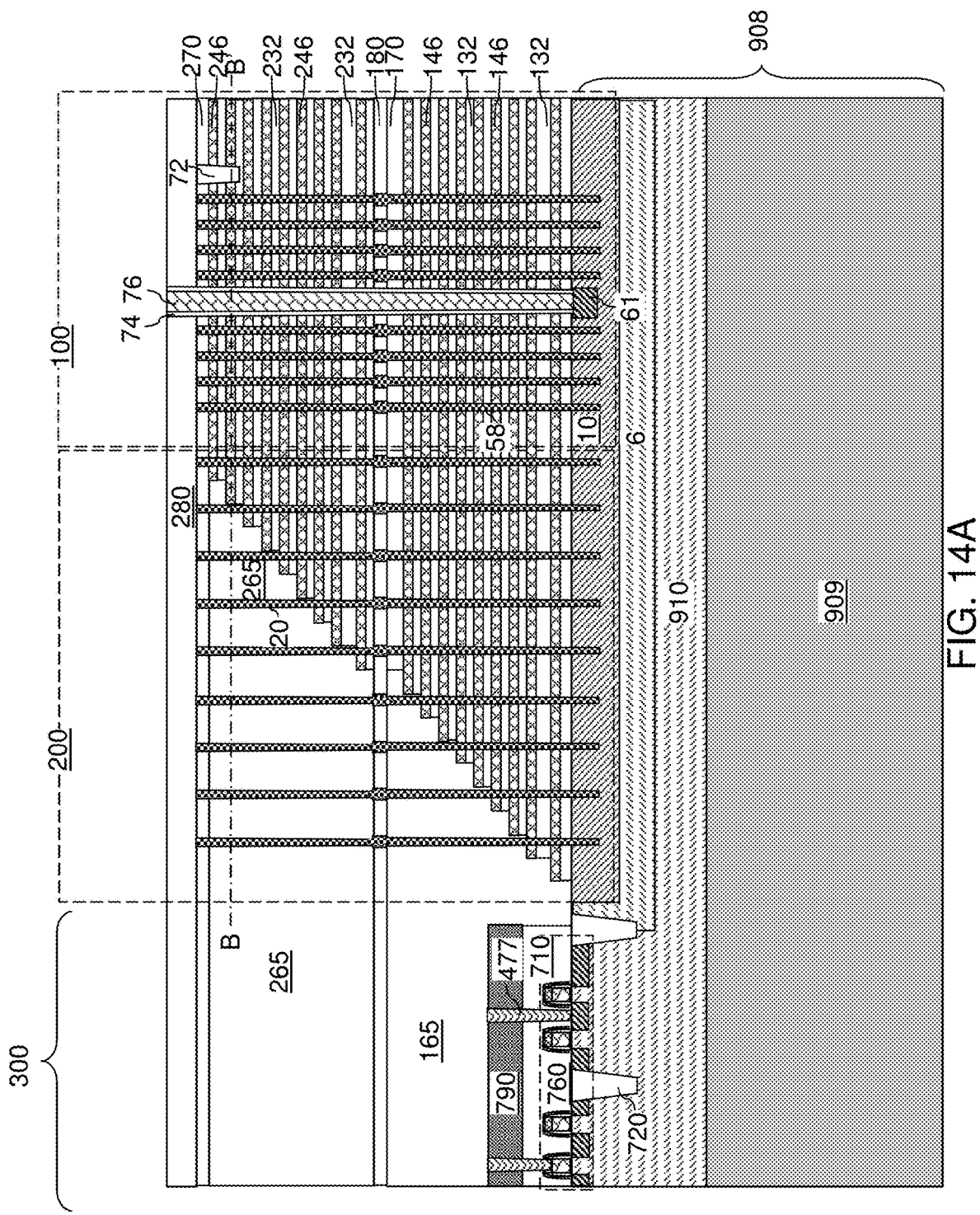
FIG. 14A is a vertical cross-sectional view of a region of the exemplary structure after formation of divider trench fill structures and slit trench fill structures according to an embodiment of the present disclosure.
Figure 14B:
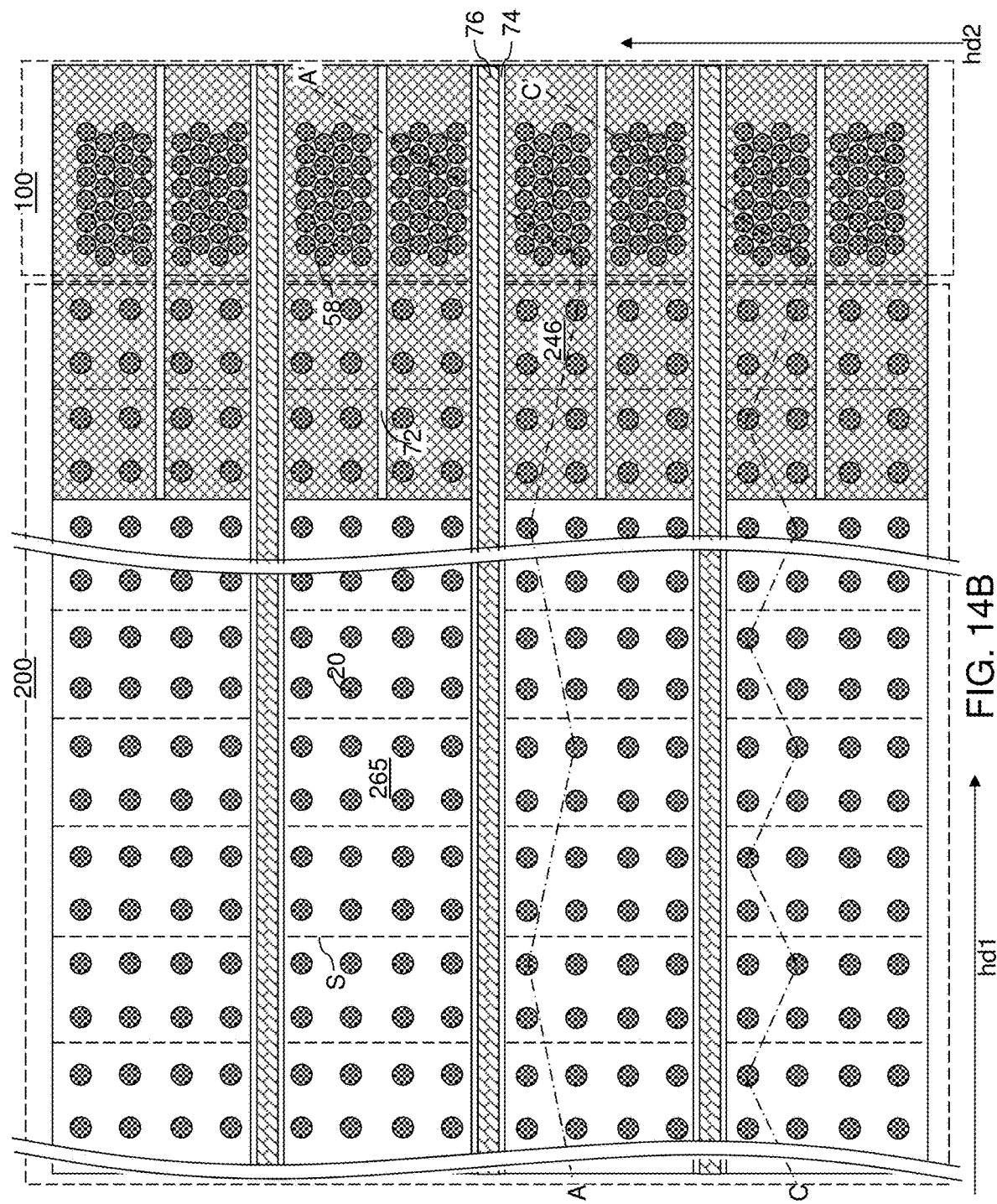
FIG. 14B is a horizontal cross-sectional of a region of the exemplary structure along the horizontal plane B-B' of FIG. 14A. The hinged vertical plane A-A' corresponds to the plane of the vertical cross-sectional view of FIG. 14A.
Figure 14C:
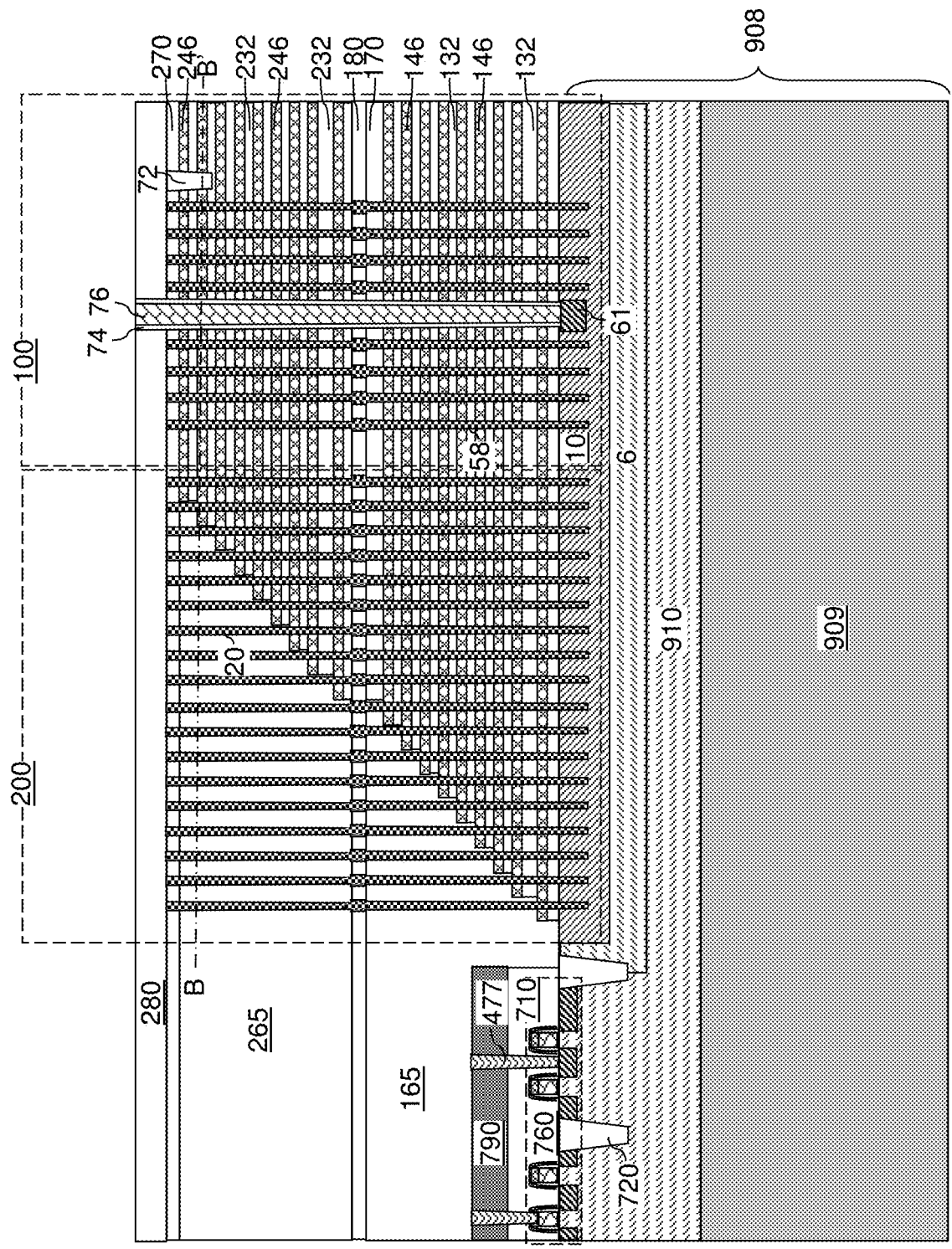
FIG. 14C is a vertical cross-sectional view of the exemplary structure along the vertical plane C-C' of FIG. 14B.
Figure 14D:
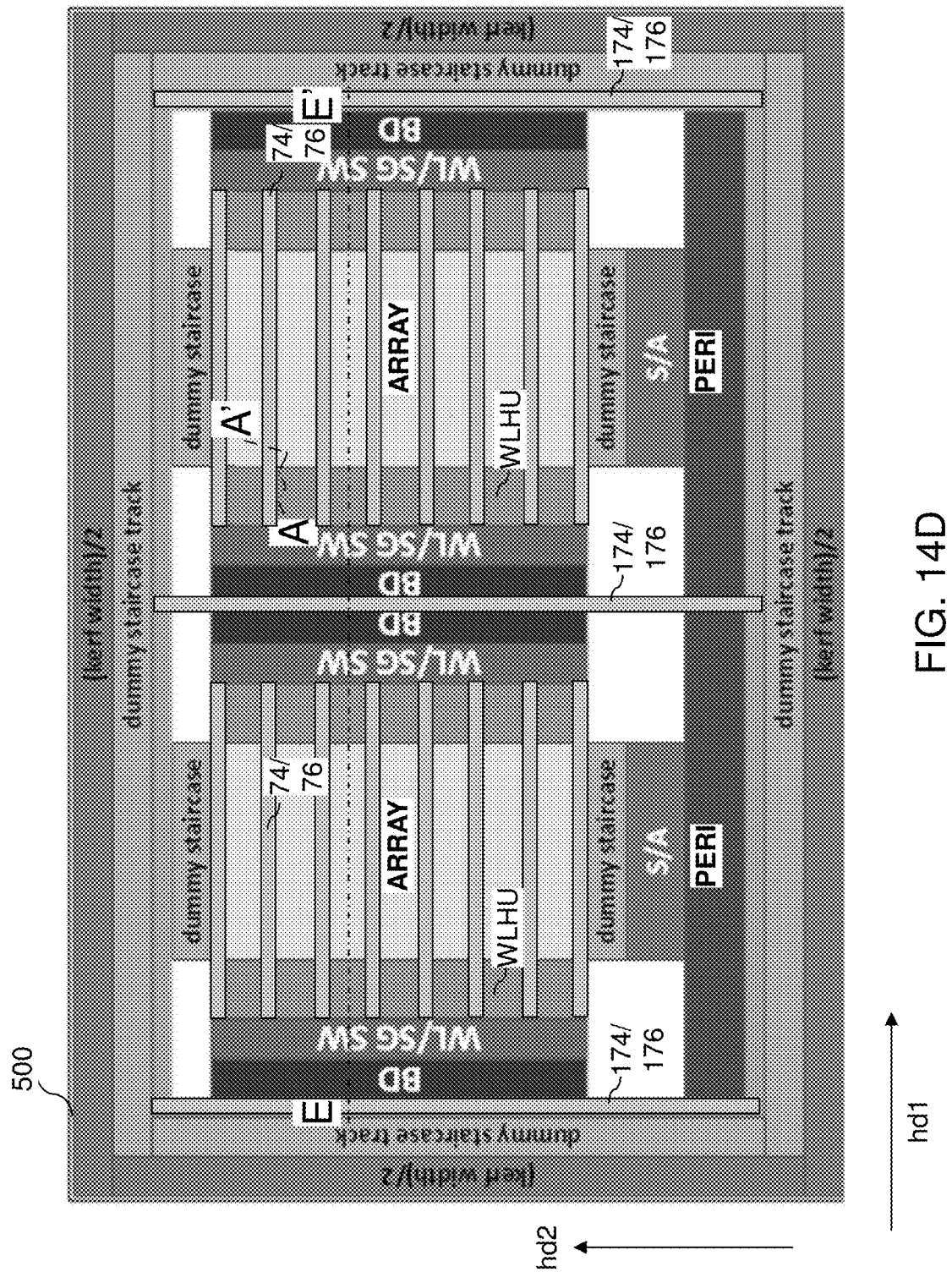
FIG. 14D is a top-down view of a unit die area of the exemplary structure of FIGS. 14A-14C.
Figure 14E:
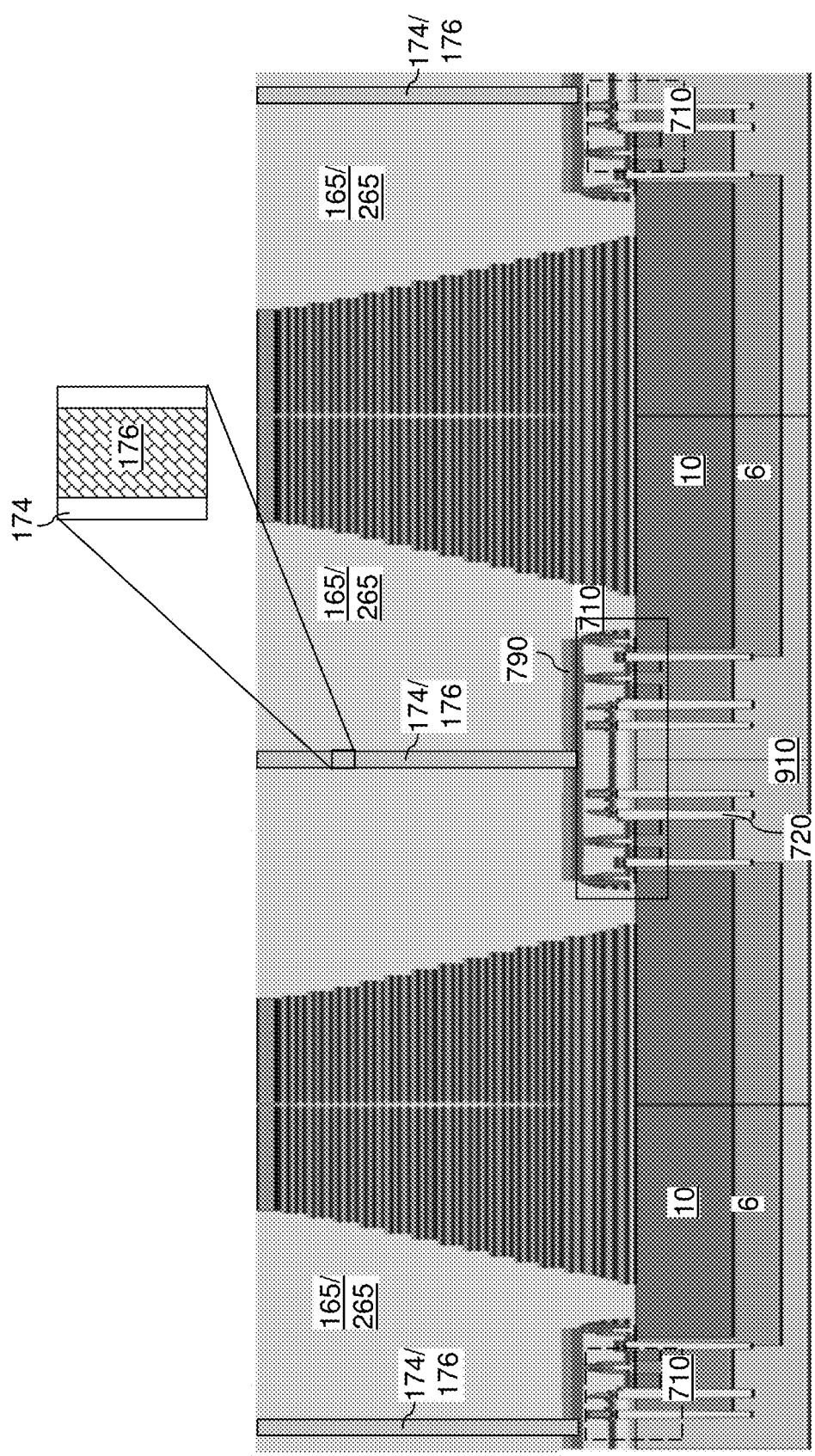
FIG. 14E is a vertical cross-sectional view of the exemplary structure along the vertical plane E-E' of FIG. 14D. The hinged vertical plane A-A' corresponds to the plane of the vertical cross-sectional view of FIG. 14A.
Figure 14F:
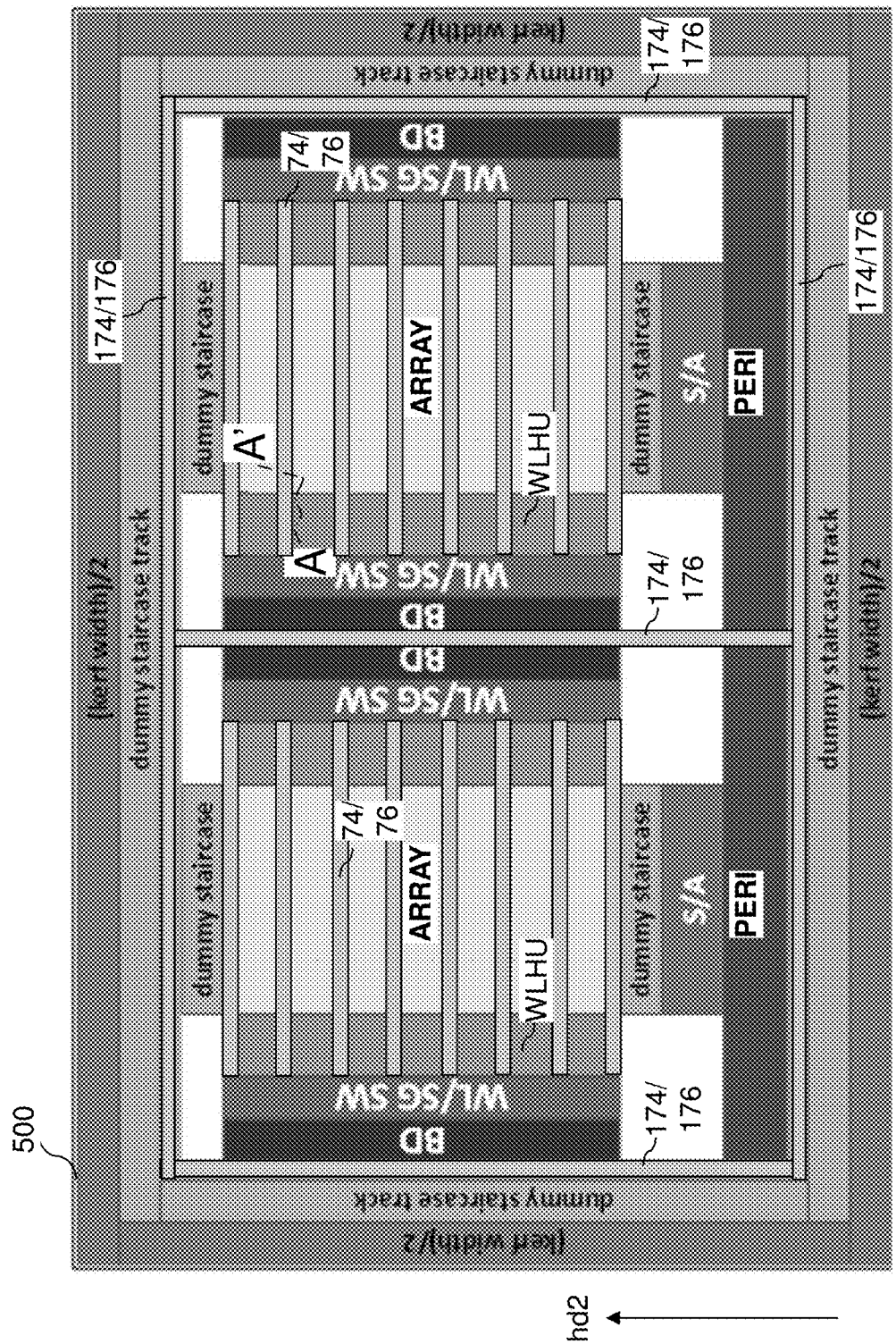
FIG. 14F is a top-down view of a unit die area of a first alternative embodiment of the exemplary structure of FIGS. 14A-14C.
Figure 14G:
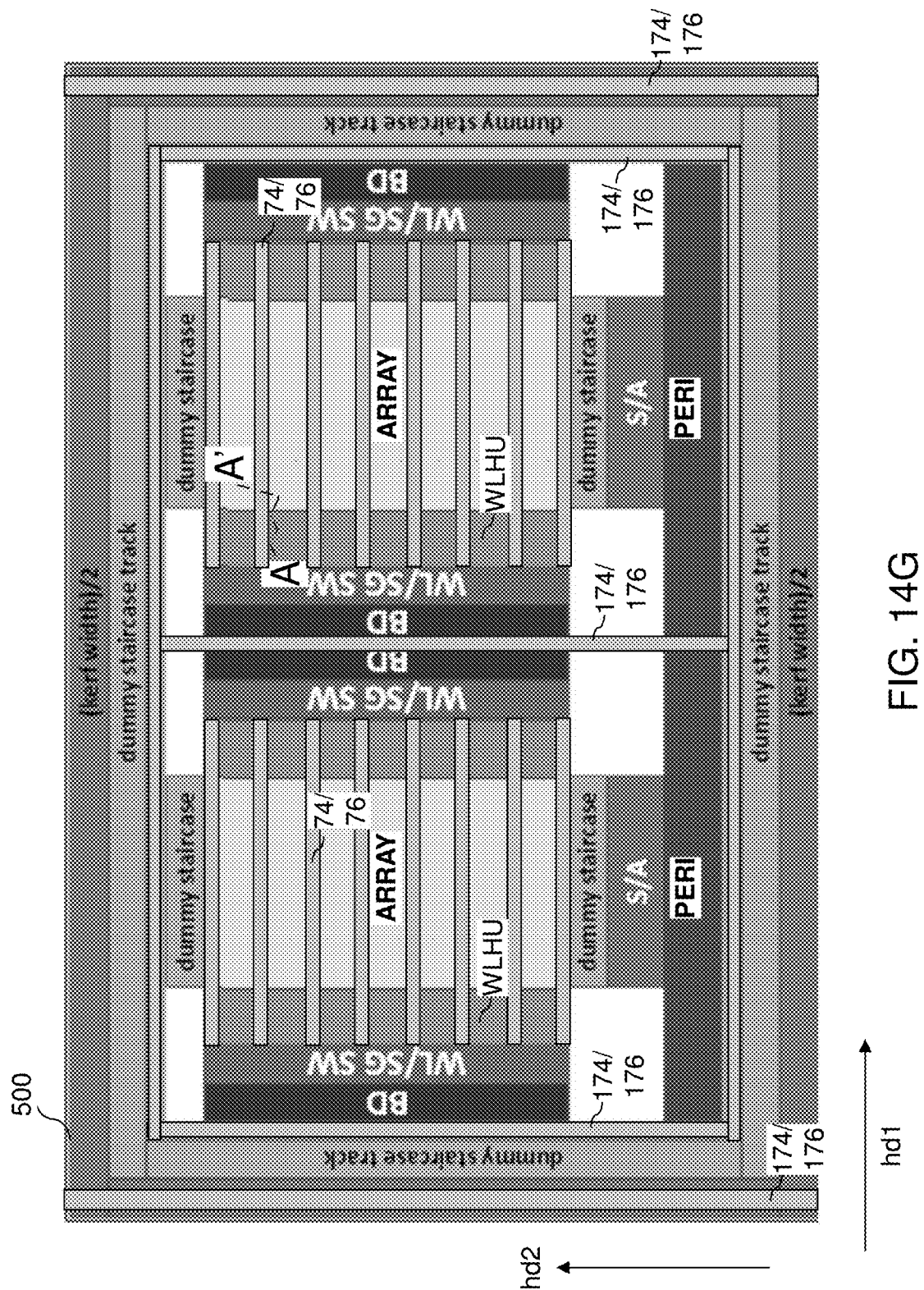
FIG. 14G is a top-down view of a unit die area of a second alternative embodiment of the exemplary structure of FIGS. 14A-14C.

Referring to FIGS. 14A-14G, various views of the exemplary structure are illustrated after formation of divider trench fill structures in the divider trenches 79 and formation of slit trench fill structures in the slit trenches 179. FIGS. 14A-14E illustrate a configuration of the exemplary structure. FIG. 14F illustrates a first alternative embodiment of the exemplary structure of FIGS. 14A-14E. FIG. 14G illustrates a second alternative embodiment of the exemplary structure of FIGS. 14A-14E. The first alternative embodiment and the second alternative embodiment are different from the structure illustrated in FIGS. 14A-14E by the presence of additional slit trench fill structures.

Generally, the divider trench fill structures and the slit trench fill structures can include at least one material that can absorb mechanical stress generated by the electrically conductive layers (146, 246). The divider trench fill structures and the slit trench fill structures may consist of at least one dielectric material, or may include a combination of a conductive material that is laterally surrounded by a dielectric material. For example, a conformal dielectric material layer (such as a silicon oxide layer) can be deposited at peripheral portions of the divider trenches 79 and the slit trenches 179, and an anisotropic etch process can be performed to remove horizontal portions of the conformal dielectric material layer. Each remaining vertical portion of the conformal dielectric material layer in the divider trenches 79 constitutes a divider trench dielectric spacer 74, and each remaining portion of the conformal dielectric material layer in the slit trenches 179 constitutes a slit trench dielectric spacer 174.

Electrical dopants can be implanted into physically exposed portions of the second doped wells 10 to form source regions 61. In one embodiment, the second doped wells 10 and the vertical semiconductor channels 60 can have a doping of a first conductivity type, and the source regions 61 can have a doping of a second conductivity type that is the opposite of the first conductivity type. For example, the first conductivity type can be p-type and the second conductivity type can be n-type, or vice versa. In case the source regions 61 are formed, the source regions 61 can have an atomic concentration of electrical dopants of the second conductivity type in a range from $5.0 \times 10^{19}/cm^3$ to $2.0 \times 10^{21}/cm^3$.

At least one conductive fill material can be deposited in the remaining volumes of the divider trenches 79 and the slit trenches 179. The at least one conductive fill material can include a material having a lower Young's modulus than the material of the electrically conductive layers (146, 246). For example, the electrically conductive layers (146, 246) can include tungsten, and the at least one conductive fill material can include doped polysilicon or a combination of doped polysilicon region and metal or metal alloy region (e.g., TiN and/or tungsten region) Excess portions of the at least one conductive fill material can be removed from above the horizontal plane including the top surface of the contact-level dielectric layer 280. Each remaining portion of the at least one conductive fill material in the divider trenches 79 can constitute a source contact via structure 76, and each remaining portion of the at least one conductive fill material in the slit trenches 179 constitute a slit trench conductive fill material portion 176. Each of the source contact via structures 76 and the slit trench conductive fill material portions 176 is a conductive fill material portion. In one embodiment, the source contact via structures 76 comprise source electrodes or local interconnects which electrically connect the source region 61 to peripheral devices 710, and the slit trench conductive fill material portions 176 can be electrically floating.

The set of all material portions filling a divider trench 79 constitutes a divider trench fill structure (74, 76), and the set of all material portions filling a slit trench 179 constitutes a slit trench fill structure (174, 176). In one embodiment, a divider trench fill structure (74, 76) can include a divider trench dielectric spacer 74 and a source contact via structure 76, and a slit trench fill structure (174, 176) can include a slit trench dielectric spacer 174 and a slit trench conductive fill material portion 176. While the present disclosure is described employing an embodiment in which each of the divider trench fill structures and the slit trench fill structures includes a respective dielectric spacer and a conductive fill material portion, embodiments are expressly contemplated herein in which each of the divider trench fill structures and the slit trench fill structures consists of only a dielectric material, such as undoped silicate glass, a doped silicate glass, organosilicate glass, or a polymer material (e.g., polyimide).

Generally, a set of at least one material can be deposited in each of the divider trenches 79 and the slit trenches 179. A plurality of divider trench fill structures can be formed in the divider trenches 79, and a plurality of slit trench fill structures can be formed in the slit trenches 179. In one embodiment, the set of at least one material within each of the plurality of divider trench fill structures (74, 76) and each of the plurality of slit trench fill structures (174, 176) comprises: a dielectric spacer (74 or 174) comprising a dielectric material and vertically extending through an entire height of a respective one of the plurality of divider trench fill structures (74, 76) and the plurality of slit trench fill structures (174, 176), and a conductive fill material portion (76, 176) comprising at least one conductive material and laterally surrounded by the dielectric spacer (74, 174). In one embodiment, each of the plurality of divider trench fill structures (74, 76) can be formed on a respective one of a plurality of doped semiconductor material portions, which include the semiconductor material layer 910, the first doped wells 6, the second doped wells 10, and the source regions 61. For example, the divider trench fill structures (74, 76) can be formed on a respective source region 61.

The divider trench fill structures (74, 76) and the slit trench fill structures (174, 176) can be simultaneously formed employing a same set of processing steps. Each of the plurality of divider trench fill structures (74, 76) and each of the plurality of slit trench fill structures (174, 176) can comprise a respective set of at least one material portion having a same material composition. A plurality of alternating stacks {(132, 146), (232, 246)} and a plurality of divider trench fill structures (74, 76) are alternately interlaced along the second horizontal direction hd2. The slit trench fill structures (174, 176) have a greater length that is greater than the width of an alternating stack {(132, 146), (232, 246)}, and can be greater than the width of multiple alternating stacks {(132, 146), (232, 246)}. A plurality of slit trench fill structures (174, 176) can laterally extend along the second horizontal direction hd2 by a lateral distance that is greater than a lateral extent along the second horizontal direction hd2 of a set of at least two neighboring alternating stacks {(132, 146), (232, 246)} of the plurality of alternating stacks {(132, 146), (232, 246)}. As used herein, neighboring alternating stacks {(132, 146), (232, 246)} refer to a set of alternating stacks {(132, 146), (232, 246)} without any intervening alternating stack {(132, 146), (232, 246)} therebetween.

In one embodiment, each of the plurality of slit trench fill structures (174, 176) is located outside an area of, and is not adjoined to, the plurality of divider trench fill structures (74, 76). In one embodiment, each of the plurality of divider trench fill structures (74, 76) contacts sidewalls of at least one alternating stack {(132, 146), (232, 246)} of the plurality of alternating stacks {(132, 146), (232, 246)} that laterally extend along the first horizontal direction hd1. In one embodiment, the plurality of slit trench fill structures (174, 176) do not directly contact any of the plurality of alternating stacks {(132, 146), (232, 246)} of insulating layers (132, 232) and electrically conductive layers (146, 246).

In one embodiment, each of the slit trench fill structures (174, 176) has a rectangular horizontal cross-sectional area with a length-to-width ratio greater than 30. In one embodiment, at least one of the conductive fill material portions (i.e., a slit trench conductive fill material portion 176) of the plurality of slit trench fill structures (174, 176) is electrically floating.

Figure 15A:
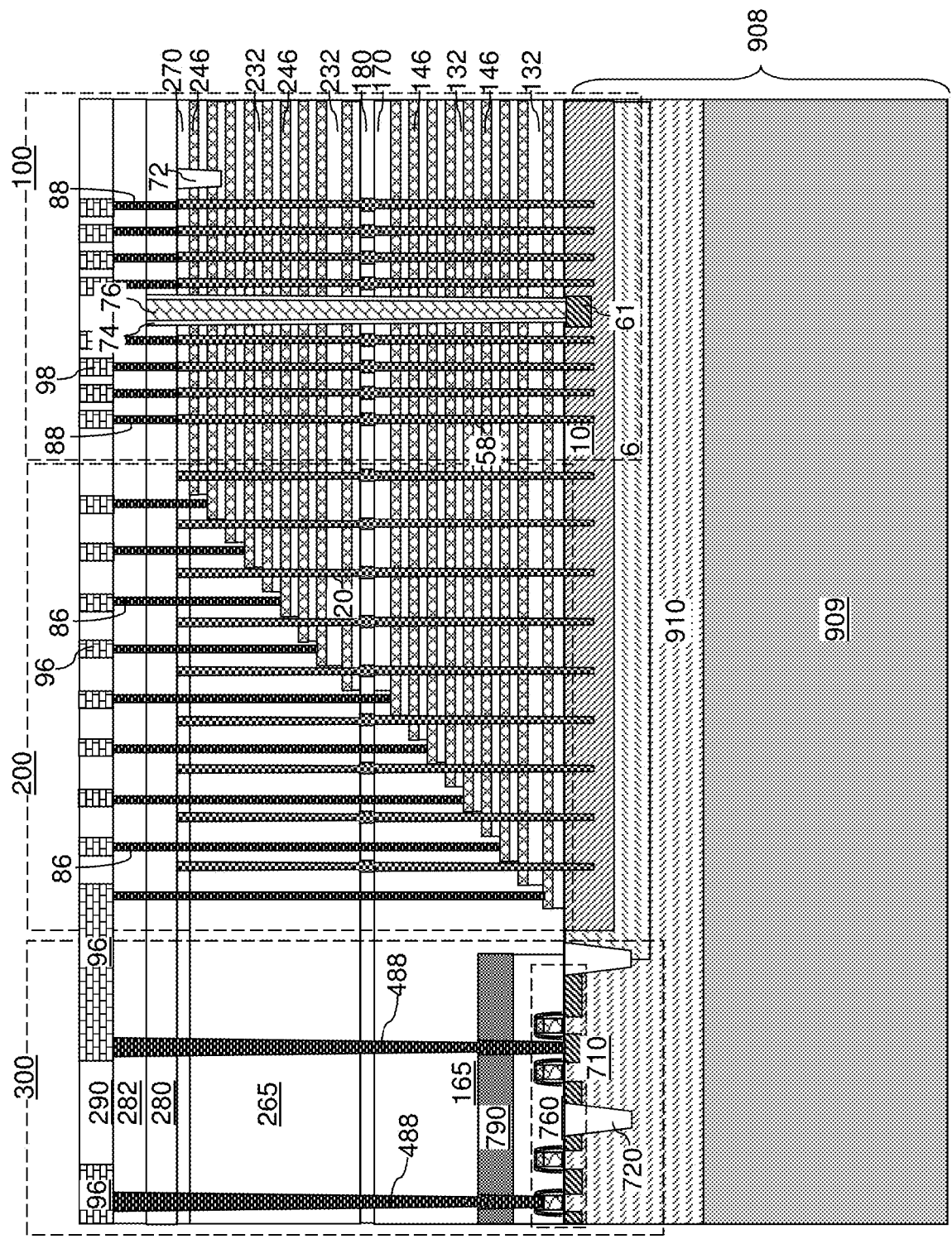
FIG. 15A is a vertical cross-sectional view of a region of the exemplary structure after formation of peripheral-device-contact via structures according to an embodiment of the present disclosure.
Figure 15B:
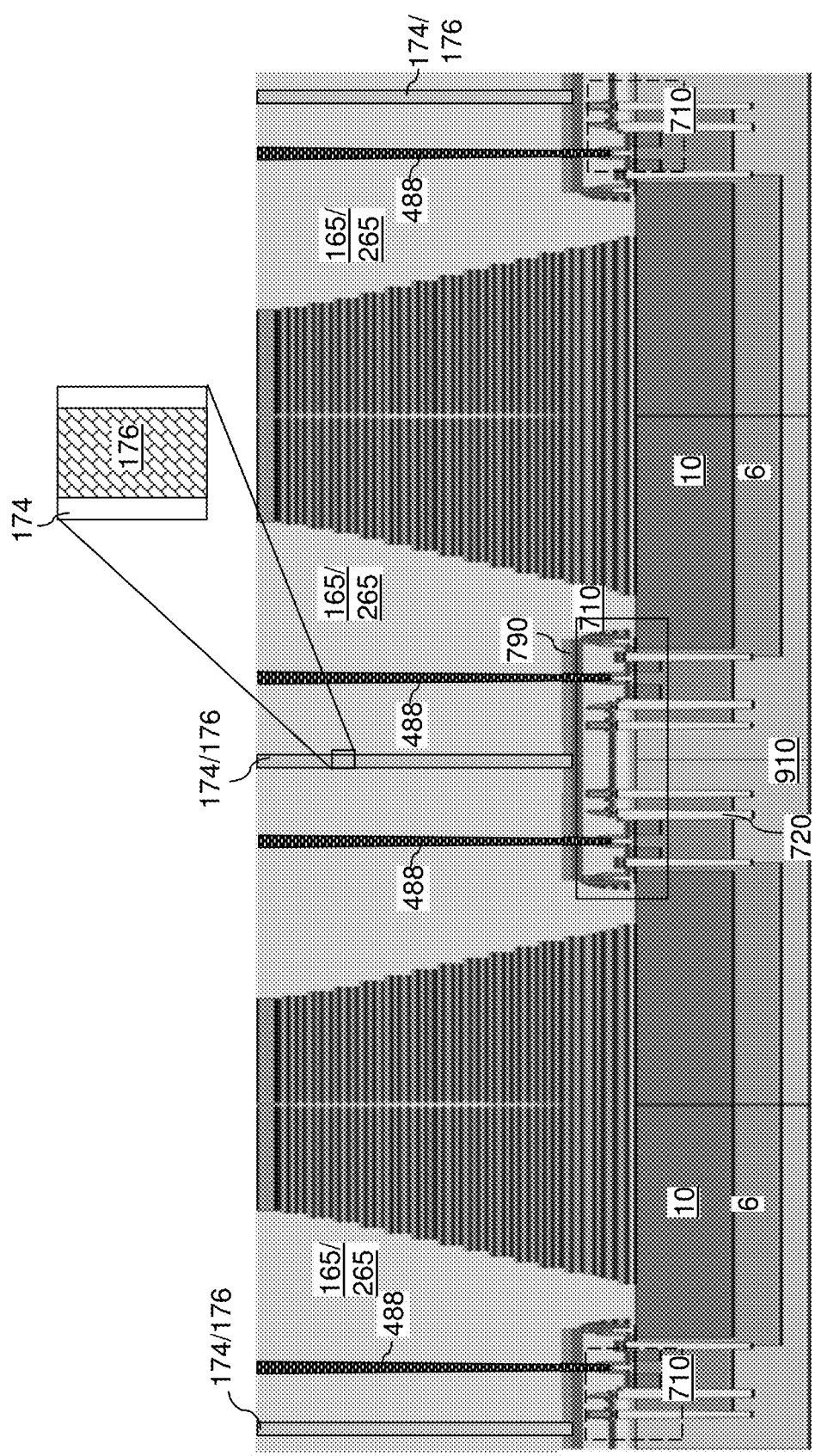
FIG. 15B is a horizontal cross-sectional view of a region of the exemplary structure of FIG. 15A.
Figure 16A:
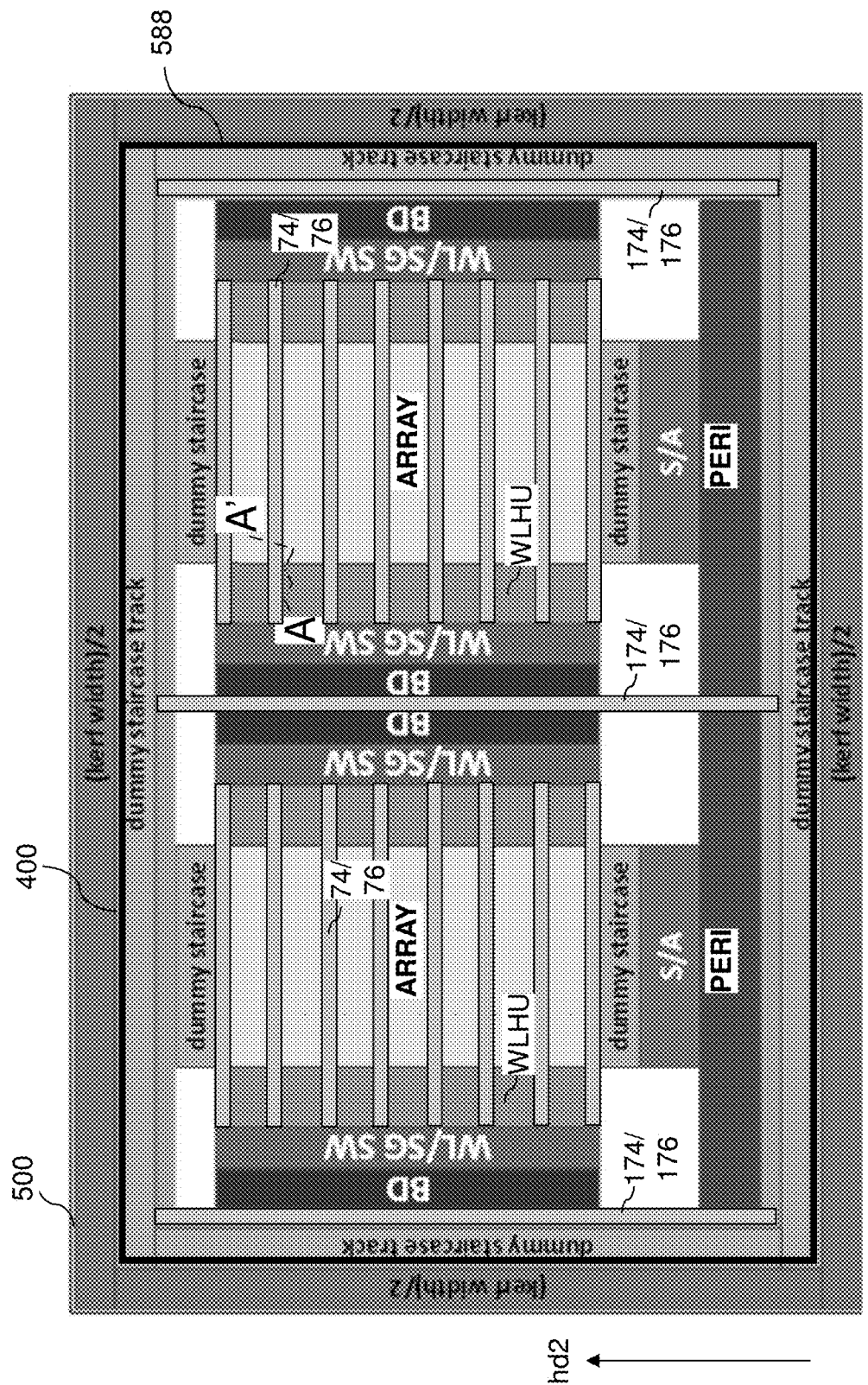
FIG. 16A is a top-down view of a unit die area of the exemplary structure after formation of a seal ring structure according to an embodiment of the present disclosure.
Figure 16B:
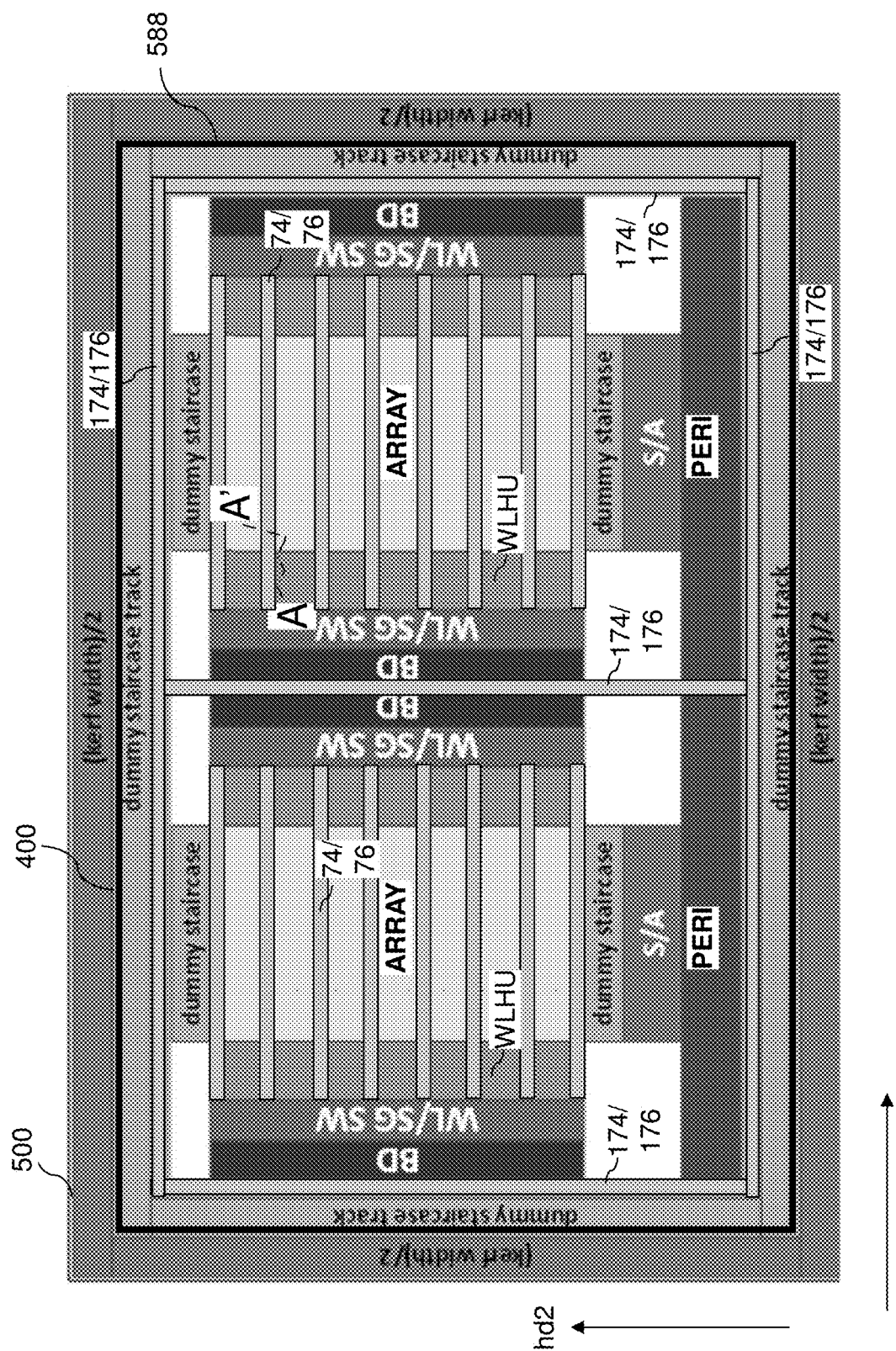
FIG. 16B is a top-down view of a unit die area of a first alternative embodiment of the exemplary structure after formation of a seal ring structure according to an embodiment of the present disclosure.
Figure 16C:
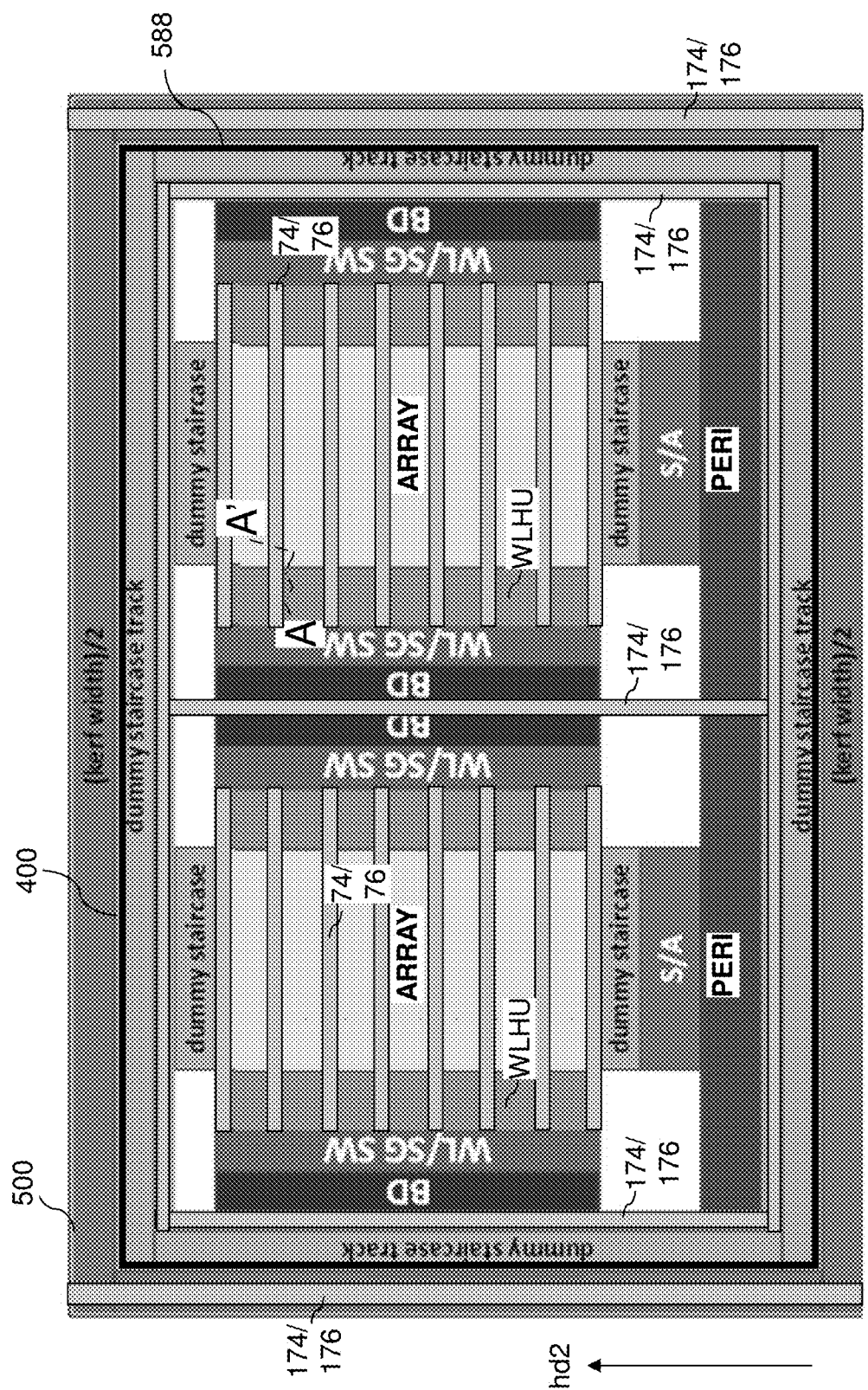
FIG. 16C is a top-down view of a unit die area of a second alternative embodiment of the exemplary structure after formation of a seal ring structure according to an embodiment of the present disclosure.
Figure 16D:
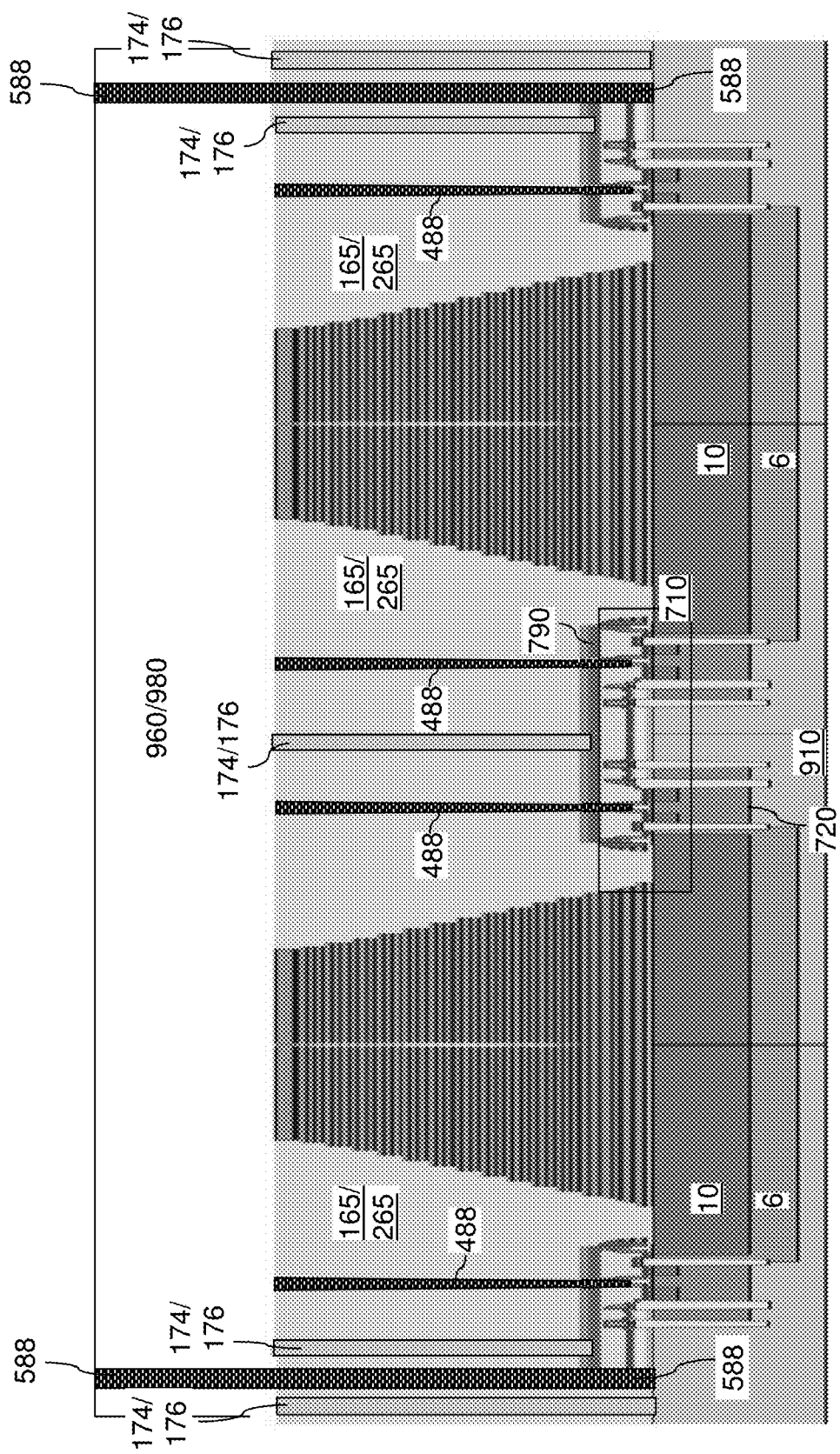
FIG. 16D is a vertical cross-sectional view of the second alternative embodiment of the exemplary structure of FIG. 16C.

Referring to FIGS. 15A and 15B, a photoresist layer (not shown) may be applied over the contact-level dielectric layer 280, and may be lithographically patterned to form various contact via openings therethrough. For example, openings for forming drain contact via structures may be formed over the drain regions 63 in the memory array regions 100, and openings for forming staircase region contact via structures may be formed in the staircase regions 200. An anisotropic etch process is performed to transfer the pattern in the photoresist layer through the contact-level dielectric layer 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Peripheral-device-contact via cavities may be formed through the contact-level dielectric layer 280 and the second and first retro-stepped dielectric material portions (265, 165) onto a top surface of a respective one of the sacrificial via structures 477. The peripheral-device-contact via cavities can be vertically extended to a top surface of a respective component of the semiconductor devices 710 by removing the sacrificial via structures 477 selective to the etch stop dielectric layer 790 and the planarization dielectric layer 760. At least one conductive material may be deposited in the peripheral-device-contact via cavities. Excess portions of the at least one conductive material may be removed from above the horizontal plane including the top surface of the contact-level dielectric layer 280. Each remaining portion of the at least one conductive material in a peripheral-device-contact via cavity constitutes a peripheral-device-contact via structure 488. The regions in which the peripheral-device-contact via structures 488 are formed are herein collectively referred to as peripheral device region 300. The peripheral device regions 300 may include sense amplifier circuits, word line and select gate electrode switch regions, and miscellaneous peripheral device regions.

A bit-line-level dielectric layer 290 can be formed over the contact-level dielectric layer 280. The bit-line-level metal interconnect structures (98, 96) can be formed in the bit-line-level dielectric layer 290. The bit-line-level metal interconnect structures (98. 96) may include bit lines 98 contacting a respective one of the drain contact via structures 88, and interconnection line structures 96 contacting, and/or electrically connected to, at least one of the staircase-region contact via structures 86 and/or the peripheral-device-contact via structures 488.

Referring to FIGS. 16A-16D, additional dielectric material layers (which are herein referred to as upper-level dielectric material layers 960) can be formed above the bit-line-level dielectric layer 290. Each of the upper-level dielectric material layers 960 can include a dielectric material such as silicon oxide. The uppermost layer of the upper-level dielectric material layers 960 can include a diffusion barrier dielectric material such as silicon nitride. Additional metal interconnect structures (which are herein referred to as upper-level metal interconnect structures 980) can be formed in the upper-level dielectric material layers 960. The upper-level metal interconnect structures 980 can include metal line structures and metal via structures that provide electrical connections between the semiconductor devices 710 and the various nodes of a three-dimensional array of memory elements including memory stack structures 55.

At least one seal ring structure 588 can be formed in region 400 along the periphery of the semiconductor die area inside the kerf areas 500. Each seal ring structure 588 can include a diffusion barrier material such as titanium nitride, tungsten, and/or silicon nitride, and can vertically extend through the upper-level dielectric material layers 960, the bit-line-level dielectric layer 290, the contact-level dielectric layer 280, and the retro-stepped dielectric material portions (165, 265), and can contact a top surface of the substrate 908. Each seal ring structure 588 laterally encloses alternating stacks of the insulating layers (132, 232) and the electrically conductive layers (146, 246). In one embodiment, at least one of the slit trench fill structures (174, 176) may be located in region 500 outside the seal ring structure(s) 588 which is located in region 400.

Referring to all drawings and according to various embodiments of the present disclosure, a semiconductor die is provided, which comprises a plurality of alternating stacks of insulating layers (132, 232) and electrically conductive layers (146, 246) that are located over a substrate 908 and laterally spaced apart by a plurality of divider trench fill structures (74, 76) that laterally extend along a first horizontal direction hd1, wherein the plurality of alternating stacks {(132, 146), (232, 246)} and the plurality of divider trench fill structures (74, 76) are alternately interlaced along a second horizontal direction hd2 that is perpendicular to the first horizontal direction hd1; a plurality of sets of memory stack structures 55, wherein each set of memory stack structures 55 vertically extends through a respective alternating stack of the plurality of alternating stacks, and wherein each of the memory stack structures 55 comprises a respective vertical semiconductor channel 60 and a respective memory film 50; and a plurality of slit trench fill structures (174, 176) that laterally extend along the second horizontal direction hd2 by a lateral distance that is greater than a lateral extent along the second horizontal direction hd2 of a set of at least two neighboring alternating stacks {(132, 146), (232, 246)} of the plurality of alternating stacks {(132, 146), (232, 246)}, wherein each of the plurality of divider trench fill structures (74, 76) and each of the plurality of slit trench fill structures (174, 176) comprise a respective set of at least one material portion having a same material composition. In one embodiment, a set of at least one material portion can be a set of a dielectric spacer (74 or 174) and a conductive fill material portion (76 or 176).

In one embodiment, each of the plurality of slit trench fill structures (174, 176) is located outside an area of, and is not adjoined to, the plurality of divider trench fill structures (74, 76). In one embodiment, each of the plurality of divider trench fill structures (74, 76) can be located entirely within memory array regions 100 and the staircase regions 200.

In one embodiment, each of the plurality of divider trench fill structures (74, 76) contacts sidewalls of at least one alternating stack {(132, 146), (232, 246)} of the plurality of alternating stacks {(132, 146), (232, 246)} that laterally extend along the first horizontal direction hd1. In one embodiment, the plurality of slit trench fill structures (174, 176) do not directly contact any of the plurality of alternating stacks of insulating layers (132, 232) and electrically conductive layers (146, 246).

In one embodiment, the semiconductor die can comprise an additional plurality of alternating stacks of insulating layers (132, 232) and electrically conductive layers (146, 246) (which may be located in a first memory array region 100 and adjoining staircase regions 200) that are laterally spaced apart from the plurality of alternating stacks of insulating layers (132, 232) and electrically conductive layers (146, 246) (which may be located in a second memory array region 200 and adjoining staircase regions 200) along the first horizontal direction hd1. One of the plurality of slit trench fill structures (174, 176) can be located between the plurality of alternating stacks and the additional plurality of alternating stacks.

In one embodiment, the semiconductor die can comprise a seal ring structure 588 that is laterally offset inward from a periphery of the semiconductor die and laterally encloses the plurality of alternating stacks {(132, 146), (232, 246)} and the plurality of divider trench fill structures (174, 176). In one embodiment, at least one of the slit trench fill structures (174, 176) can be located outside the seal ring structure. In one embodiment, each of the slit trench fill structures (174, 176) has a rectangular horizontal cross-sectional area with a length-to-width ratio greater than 30.

In one embodiment, each set of at least one material portion within each of the plurality of divider trench fill structures (74, 76) and each of the plurality of slit trench fill structures (174, 176) comprises: a dielectric spacer (74 or 174) comprising a dielectric material and vertically extending through an entire height of a respective one of the plurality of divider trench fill structures (74, 76) and the plurality of slit trench fill structures (174, 176); and a conductive fill material portion (76 or 176) comprising at least one conductive material and laterally surrounded by the dielectric spacer (74 or 174). In one embodiment, at least one of the conductive fill material portions 176 of the plurality of slit trench fill structures (174, 176) is electrically floating.

In one embodiment, the semiconductor die comprises field effect transistors (as a subset of semiconductor devices 710) located on a top surface of the substrate 908 and not in direct contact with the plurality of alternating stacks {(132, 146), (232, 246)}; and an etch stop dielectric layer 790 overlying the field effect transistors, wherein at least one of the plurality of slit trench fill structures (174, 176) overlies, and contacts, the etch stop dielectric layer 790.

In one embodiment, the substrate 908 comprises a semiconductor material layer 910 containing a plurality of doped semiconductor material portions (6, 10, 61); and each of the plurality of divider trench fill structures (74, 76) contacts a respective one of the plurality of doped semiconductor material portions (6, 10, 61).

In one embodiment, each of the memory films 50 comprises: a charge storage layer 54 extending through multiple electrically conductive layers (146, 246) within a respective one of the plurality of alternating stacks of insulating layers (132, 232) and electrically conductive layers (146, 256); and a tunneling dielectric layer 56 contacting the charge storage layer 54 and a respective one of the vertical semiconductor channels 60.

In one embodiment, each alternating stack {(132, 246), (232, 246)} of the plurality of alternating stacks {(132, 246), (232, 246)} comprises a respective staircase region 200 in which electrically conductive layers (146, 246) have lateral extents that decrease with an increase in a vertical distance from the substrate 908.

The various structures of the present disclosure provide slit trench fill structures (174, 176) that laterally extend along a horizontal direction that is perpendicular to the lengthwise direction of divider trench fill structures (74, 76). The slit trench fill structures (174, 176) alleviate and absorb the mechanical stress that the electrically conductive layers (146, 246) generate along the lengthwise direction of the divider trench fill structures (74, 76). By decreasing the difference between the mechanical stress along the lengthwise direction of the divider trench fill structures (74, 76) and the mechanical stress along the widthwise direction of the divider trench fill structures (74, 76), warpage of the substrate 908 and structures thereupon can be reduced. For example, bonding of a wafer including the substrate 908 and a two-dimensional array of semiconductor dies thereupon to another wafer including a two-dimensional array of semiconductor dies (which may be logic dies or memory dies) can be facilitated through reduction of the wafer warpage, which is provided by utilization of the slit trench fill structures (174, 176) of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor die comprising:
   field effect transistors located on a top surface of a semiconductor material layer in a substrate, the field effect transistors comprising a respective surface portion of the semiconductor material layer as a respective channel;
   an etch stop dielectric layer overlying the field effect transistors,
   a plurality of alternating stacks of insulating layers and electrically conductive layers that are located over the substrate and laterally spaced apart by a plurality of divider trench fill structures that laterally extend along a first horizontal direction, wherein the plurality of alternating stacks and the plurality of divider trench fill structures are alternately interlaced along a second horizontal direction that is perpendicular to the first horizontal direction;
   a plurality of sets of memory stack structures, wherein each set of memory stack structures vertically extends through a respective alternating stack of the plurality of alternating stacks; and
   a plurality of slit trench fill structures located over the substrate and laterally spaced from the plurality of alternating stacks;
   wherein each of the plurality of divider trench fill structures and each of the plurality of slit trench fill structures comprise a dielectric spacer comprising a dielectric material and vertically extending through an entire height of a respective one of the plurality of divider trench fill structures and the plurality of slit trench fill structures, and comprise a conductive fill material portion comprising at least one conductive material and laterally surrounded by the dielectric spacer; and
   wherein each dielectric spacer and each conductive fill material portion of at least one of the plurality of slit trench fill structures overlie, and contact, a portion of the etch stop dielectric layer.

2. The semiconductor die of claim 1, wherein each of the plurality of slit trench fill structures is located outside an area of, and is not adjoined to, the plurality of divider trench fill structures.

3. The semiconductor die of claim 1, wherein:
   each of the plurality of divider trench fill structures contacts sidewalls of at least one alternating stack of the plurality of alternating stacks that laterally extend along the first horizontal direction; and
   the plurality of slit trench fill structures do not directly contact any of the plurality of alternating stacks of insulating layers and electrically conductive layers.

4. The semiconductor die of claim 1, further comprising an additional plurality of alternating stacks of insulating layers and electrically conductive layers that are laterally spaced apart from the plurality of alternating stacks of insulating layers and electrically conductive layers along the first horizontal direction, wherein one of the plurality of slit trench fill structures is located between the plurality of alternating stacks and the additional plurality of alternating stacks.

5. The semiconductor die of claim 1, further comprising:
upper-level dielectric material layers overlying the plurality of divider trench fill structures and the plurality of slit trench fill structures; and
a seal ring structure that is laterally offset inward from a periphery of the semiconductor die, and laterally encloses the plurality of alternating stacks and the plurality of divider trench fill structures, and continuously vertically extending from a topmost surface of the upper-level dielectric material layers to a top surface of the substrate and consisting essentially of at least one diffusion barrier material, wherein at least one of the slit trench fill structures is located outside the seal ring structure.

6. The semiconductor die of claim 5, wherein:
the seal ring structure contacts a sidewall of the etch stop dielectric layer; and
the at least one of the slit trench fill structures that is located outside the seal ring structure contacts a top surface of the substrate, and is located outside the area of the field effect transistors.

7. The semiconductor die of claim 1, wherein each of the slit trench fill structures has a rectangular horizontal cross-sectional area with a length-to-width ratio greater than 30.

8. The semiconductor die of claim 1, wherein at least one of the conductive fill material portions of the plurality of slit trench fill structures is electrically floating.

9. The semiconductor die of claim 1, wherein:
the substrate comprises a semiconductor material layer containing a plurality of doped semiconductor material portions; and
each of the plurality of divider trench fill structures contacts a respective one of the plurality of doped semiconductor material portions.

10. The semiconductor die of claim 1, wherein each of the memory stack structures comprises:
a memory film extending through multiple electrically conductive layers within a respective one of the plurality of alternating stacks of insulating layers and electrically conductive layers; and
a vertical semiconductor channel that contacts the memory film.

11. The semiconductor die of claim 1, wherein each alternating stack of the plurality of alternating stacks comprises a respective staircase region in which electrically conductive layers have lateral extents that decrease with an increase in a vertical distance from the substrate.

12. The semiconductor die of claim 1, wherein a subset of slit trench fill structures of the plurality of slit trench fill structures laterally extends along the second horizontal direction by a lateral distance that is greater than a lateral extent along the second horizontal direction of a set of at least two neighboring alternating stacks of the plurality of alternating stacks.

13. A method of forming a semiconductor structure, comprising:
forming field effect transistors on a top surface of a semiconductor material layer in a substrate, the field effect transistors comprising a respective surface portion of the semiconductor material layer as a respective channel;
forming an etch stop dielectric layer over the field effect transistors;
forming a vertically alternating sequence of continuous insulating layers and continuous sacrificial material layers over the substrate;
forming stepped surfaces at peripheral portions of the vertically alternating sequence;
forming a dielectric material portion over the stepped surfaces and over the etch stop dielectric layer;
forming a plurality of sets of memory stack structures, wherein each set of memory stack structures vertically extends through a respective region of the vertically alternating sequence;
forming divider trenches and slit trenches, wherein the divider trenches laterally extend along a first horizontal direction and divide the vertically alternating sequence into a plurality of alternating stacks of insulating layers and sacrificial material layers, and wherein one of the slit trenches is formed through the dielectric material portion and extends to the etch stop dielectric layer;
replacing the sacrificial material layers in the plurality of alternating stacks with electrically conductive layers employing the divider trenches as a conduit for an etchant that etches the sacrificial material layers and for a reactant that deposits a conductive material of the electrically conductive layers;
simultaneously depositing a set of at least one material comprising at least one dielectric material in each of the divider trenches and the slit trenches, wherein a plurality of divider trench fill structures is formed in the divider trenches and a plurality of slit trench fill structures is formed in the slit trenches, and at least one of the plurality of slit trench fill structures is formed on the etch stop dielectric layer;
forming upper-level dielectric material layers over the plurality of divider trench fill structures and the plurality of slit trench fill structures; and
forming a seal ring structure after formation of the plurality of divider trench fill structures and the plurality of slit trench fill structures, wherein the seal ring structure vertically extends from a topmost surface of the upper-level dielectric material layers to a top surface of the substrate and laterally encloses alternating stacks of the insulating layers and the electrically conductive layers, wherein at least one of the slit trench fill structures is located outside the seal ring structure.

14. A semiconductor die comprising:
a plurality of alternating stacks of insulating layers and electrically conductive layers that are located over a substrate and laterally spaced apart by a plurality of divider trench fill structures that laterally extend along a first horizontal direction, wherein the plurality of alternating stacks and the plurality of divider trench fill structures are alternately interlaced along a second horizontal direction that is perpendicular to the first horizontal direction;
a plurality of sets of memory stack structures, wherein each set of memory stack structures vertically extends through a respective alternating stack of the plurality of alternating stacks;
a plurality of slit trench fill structures located over the substrate and laterally spaced from the plurality of alternating stacks, wherein each of the plurality of divider trench fill structures and the plurality of slit trench fill structures comprises a same set of material portions including at least a dielectric material portion;

upper-level dielectric material layers overlying the plurality of divider trench fill structures and the plurality of slit trench fill structures; and a seal ring structure that is laterally offset inward from a periphery of the semiconductor die, and laterally encloses the plurality of alternating stacks and the plurality of divider trench fill structures, and continuously vertically extending from a topmost surface of the upper-level dielectric material layers to a top surface of the substrate and consisting essentially of at least one diffusion barrier material, wherein at least one of the plurality of slit trench fill structures is located outside the seal ring structure.

15. The semiconductor die of claim 14, wherein:

each of the plurality of divider trench fill structures and each of the plurality of slit trench fill structures comprise a dielectric spacer comprising a dielectric material and vertically extending through an entire height of a respective one of the plurality of divider trench fill structures and the plurality of slit trench fill structures, and comprise a conductive fill material portion; and the at least one diffusion barrier material is selected from titanium nitride, tungsten, and silicon nitride.

16. The semiconductor die of claim 15, further comprising:

field effect transistors located on a top surface of a semiconductor material layer in the substrate, the field effect transistors comprising a respective surface portion of the semiconductor material layer as a respective channel; and an etch stop dielectric layer overlying the field effect transistors, wherein each dielectric spacer and each conductive fill material portion of at least one of the plurality of slit trench fill structures overlie, and contact, the etch stop dielectric layer.

* * * * *